(12) United States Patent  (10) Patent No.: US 12,415,230 B2
Mori  (45) Date of Patent: Sep. 16, 2025

(54) SUBSTRATE PROCESSING APPARATUS AND SUBSTRATE PROCESSING METHOD

(71) Applicant: Tokyo Electron Limited, Tokyo (JP)

(72) Inventor: Hirotoshi Mori, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 943 days.

(21) Appl. No.: 17/436,664

(22) PCT Filed: Feb. 26, 2020

(86) PCT No.: PCT/JP2020/007699
§ 371 (c)(1),
(2) Date: Sep. 7, 2021

(87) PCT Pub. No.: WO2020/184179
PCT Pub. Date: Sep. 17, 2020

(65) Prior Publication Data
US 2022/0184733 A1  Jun. 16, 2022

(30) Foreign Application Priority Data
Mar. 8, 2019 (JP) .................. 2019-042994

(51) Int. Cl.
*B23K 26/53* (2014.01)
*B23K 26/03* (2006.01)
(Continued)

(52) U.S. Cl.
CPC .......... *B23K 26/048* (2013.01); *B23K 26/032* (2013.01); *B23K 2101/40* (2018.08)

(58) Field of Classification Search
CPC  B23K 26/048; B23K 26/032; B23K 2101/40; B23K 2103/56; B23K 26/53;
(Continued)

(56) References Cited

U.S. PATENT DOCUMENTS

2005/0224475 A1* 10/2005 Nomaru ............. B23K 26/0853
219/121.82
2007/0119835 A1* 5/2007 Nomaru ............... B23K 26/53
219/121.73
(Continued)

FOREIGN PATENT DOCUMENTS

CN  105014240 A  11/2015
CN  108393578 A  8/2018
(Continued)

OTHER PUBLICATIONS

International Search Report of PCT/JP2020/007699 dated May 19, 2020.
(Continued)

*Primary Examiner* — Tiffany T Tran
(74) *Attorney, Agent, or Firm* — Shih IP Law Group, PLLC.

(57) ABSTRACT

A substrate processing apparatus includes an imaging device configured to image a first substrate held by a holder; a modifying device configured to form a modification layer by radiating laser light to an inside of the first substrate held by the holder along a boundary between a peripheral portion of the first substrate as a removing target and a central portion thereof; a first moving device configured to move the holder and the imaging device relatively; and a controller configured to control the holder, the imaging device, the modifying device, and the first moving device. The controller controls the holder, the imaging device and the first moving device to perform the focus adjustment of the imaging device and/or the imaging by the imaging device while moving the holder and the imaging device relatively.

20 Claims, 21 Drawing Sheets

(51) Int. Cl.
*B23K 26/04* (2014.01)
*B23K 101/40* (2006.01)

(58) Field of Classification Search
CPC ... B23K 26/046; H01L 21/304; H01L 21/683; H01L 21/67092; H01L 21/67115; H01L 21/67259; H01L 21/68764; G05B 2219/45041; G02B 21/241; G02B 21/26
USPC .................................................. 219/121.83
See application file for complete search history.

(56) References Cited

U.S. PATENT DOCUMENTS

| | | | | |
|---|---|---|---|---|
| 2011/0132885 | A1* | 6/2011 | Sercel | B23K 26/0738 219/121.72 |
| 2013/0248504 | A1* | 9/2013 | Kusuda | H01L 21/67115 219/121.85 |
| 2014/0099476 | A1* | 4/2014 | Subramanian | B29C 64/153 428/164 |
| 2015/0140785 | A1* | 5/2015 | Kwak | H01L 21/02013 438/464 |
| 2018/0055365 | A1* | 3/2018 | Ishikawa | G01B 9/02044 |
| 2018/0076043 | A1* | 3/2018 | Ito | B23K 26/0823 |
| 2018/0286755 | A1* | 10/2018 | Takenouchi | B23K 26/364 |
| 2019/0351504 | A1* | 11/2019 | Reisacher | B23K 26/032 |

FOREIGN PATENT DOCUMENTS

| | | |
|---|---|---|
| JP | H9 216152 A | 8/1997 |
| JP | 2004111606 A | 4/2004 |
| JP | 2006093333 A | 4/2006 |
| JP | 2006108532 A | 4/2006 |
| JP | 2009131942 A | 6/2009 |
| JP | 2009135342 A | 6/2009 |
| JP | 2010165802 A | 7/2010 |
| JP | 2011159798 A | 8/2011 |
| JP | 2012064667 A | 3/2012 |
| JP | 2014167966 A | 9/2014 |
| JP | 2017071074 A | 4/2017 |
| JP | 2017191825 A | 10/2017 |
| JP | 2018129540 A | 8/2018 |

OTHER PUBLICATIONS

International Search Report of PCT/JP2019/008120 dated May 28, 2019.

* cited by examiner

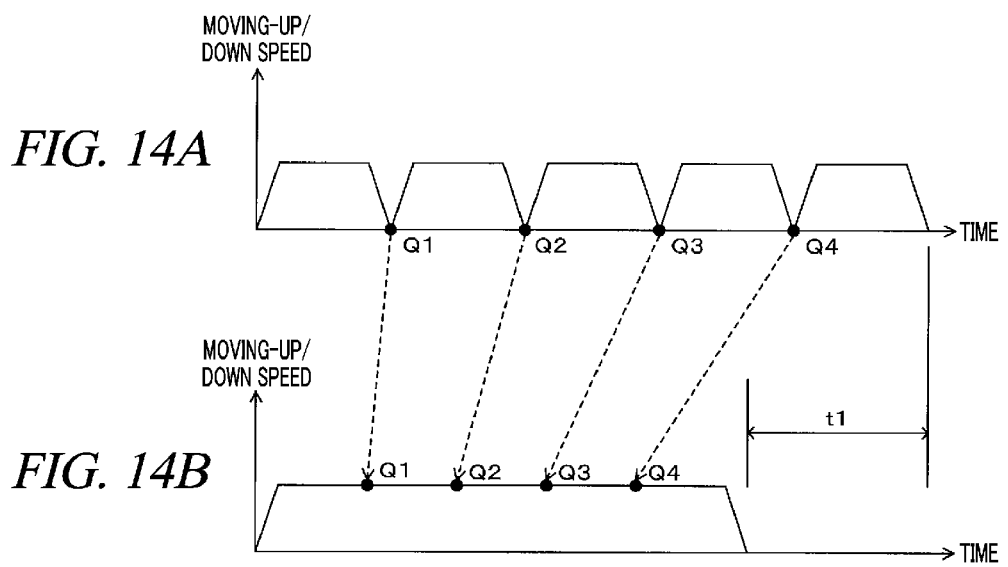
FIG. 14A
FIG. 14B
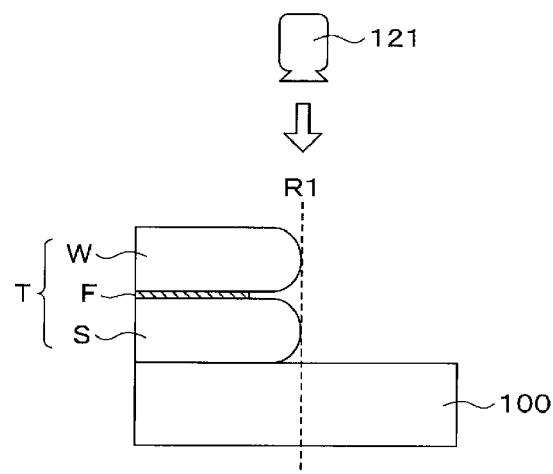
FIG. 15

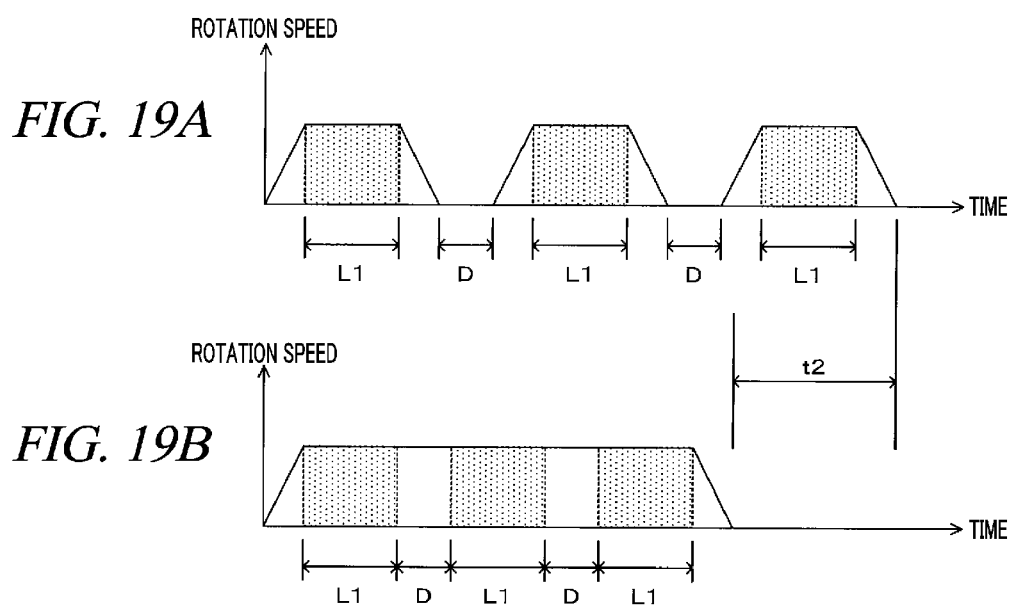
FIG. 19A
FIG. 19B
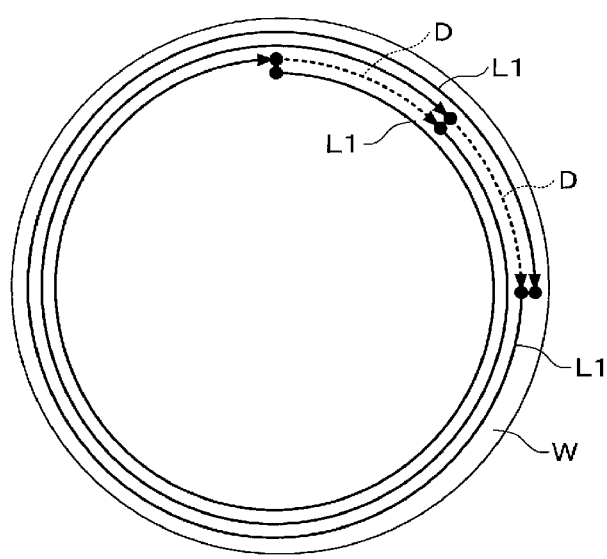
FIG. 20

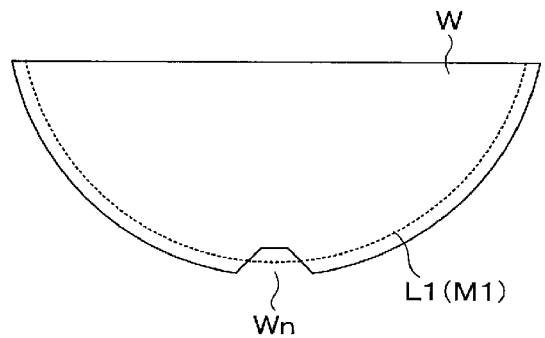
FIG. 23A
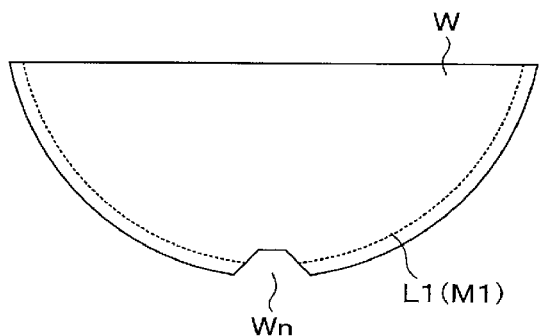
FIG. 23B
FIG. 24
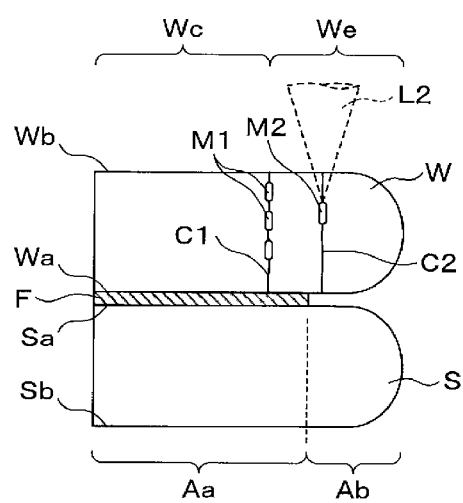

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2020/007699 filed on Feb. 26, 2020, which claims the benefit of Japanese Patent Application No. 2019-042994 filed on Mar. 8, 2019, the entire disclosures of which are incorporated herein by reference.

TECHNICAL FIELD

The various aspects and embodiments described herein pertain generally to a substrate processing apparatus and a substrate processing method.

BACKGROUND

It is described in Patent Document 1 that a circular plate-shaped grinding tool having abrasive grains at a peripheral portion thereof is rotated and at least an outer peripheral surface of the grinding tool is brought into linear contact with a semiconductor wafer to grind a circumferential end of the semiconductor wafer into a substantially L-shape. The semiconductor wafer is produced by bonding two sheets of silicon wafers.

PRIOR ART DOCUMENT

Patent Document 1: Japanese Patent Laid-open Publication No. H09-216152

DISCLOSURE OF THE INVENTION

Means for Solving the Problems

In an exemplary embodiment, there is provided a substrate processing apparatus configured to process a combined substrate in which a first substrate and a second substrate are bonded to each other. The substrate processing apparatus includes a holder configured to hold the combined substrate from a second substrate side; an imaging device configured to image the first substrate held by the holder; a modifying device configured to form a modification layer by radiating laser light to an inside of the first substrate held by the holder along a boundary between a peripheral portion of the first substrate as a removing target and a central portion thereof; a first moving device configured to move the holder and the imaging device relatively; a second moving device configured to move the holder and the modifying device relatively; and a controller configured to control the holder, the imaging device, the modifying device, the first moving device and the second moving device. The imaging device images multiple points of the first substrate after performing focus adjustment at plural points of the first substrate, and the controller controls the holder, the imaging device and the first moving device to perform the focus adjustment of the imaging device and/or the imaging by the imaging device while moving the holder and the imaging device relatively.

BRIEF DESCRIPTION OF THE DRAWINGS

FIG. 14A and FIG. 14B are explanatory diagrams illustrating timing for performing focus adjustment with respect to a moving-up/down of a macro-camera.

FIG. 15 is an explanatory diagram showing a state in which a macro-camera images an outer end portion of a processing target wafer.

FIG. 19A and FIG. 19B are explanatory diagrams schematically illustrating a method of forming a plurality of peripheral modification layers.

FIG. 20 is an explanatory diagram showing a state in which a plurality of peripheral modification layers is being formed.

FIG. 23A and FIG. 23B are explanatory diagrams illustrating a notch and the vicinity thereof in forming the peripheral modification layer in the processing target wafer.

FIG. 24 is an explanatory diagram showing a state in which a split modification layer is being formed in the processing target wafer.

DETAILED DESCRIPTION

Figure 1:
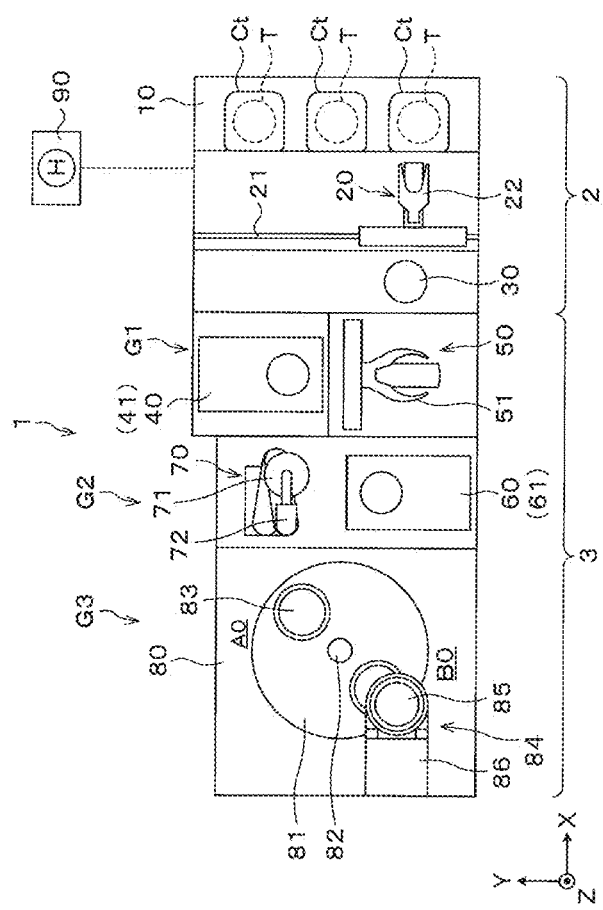
FIG. 1 is a plan view schematically illustrating a configuration of a wafer processing system according to an exemplary embodiment.

In a manufacturing process for a semiconductor device, a wafer having a plurality of devices such as electronic circuits formed on a front surface thereof is thinned by grinding a rear surface of the wafer.

Typically, a peripheral portion of the wafer is chamfered. If, however, the grinding processing is performed on the wafer as stated above, the peripheral portion of the wafer is given a sharp pointed shape (a so-called knife edge shape). If so, chipping takes place at the peripheral portion of the wafer, and the wafer may be damaged. Thus, there is performed a so-called edge trimming of removing the peripheral portion of the wafer prior to the grinding processing.

The end surface grinding apparatus described in the aforementioned Patent Document 1 is an apparatus configured to perform this edge trimming. When grinding the peripheral portion of the wafer by using this end surface grinding apparatus, the wafer with a support substrate bonded thereto is first fixed on a table, and the table is rotated around an axis parallel to a vertical axis. Then, while rotating a wheel as a grinding tool by rotating a spindle, the spindle is moved in a vertical direction, thus allowing a grinding surface of the wheel to come into contact with the wafer so that the peripheral portion of the wafer is ground. In this end surface grinding apparatus, however, the movement of the spindle in the vertical direction may not be uniform due to various factors such as tolerance, for example. In such a case, the vertical movement of the wheel may not be appropriately controlled, raising a concern that even a surface of the support substrate may be ground.

In view of the foregoing problem, a modification layer is formed by radiating laser light along a boundary between the peripheral portion of the wafer as a removing target and a central portion thereof, and the peripheral portion is removed starting from this modification layer. In such a case, since the modification layer is formed only in the wafer, the support substrate is not affected at all, and the surface of the support substrate is not ground. In the edge trimming using the laser light, however, there is still a room for improvement when it comes to throughput.

The present disclosure provides a technique capable of performing the edge trimming efficiently with a reduced processing time. Hereinafter, a wafer processing system equipped with a modifying apparatus as a substrate processing apparatus and a wafer processing method as a substrate processing method according to an exemplary embodiment will be described with reference to the accompanying drawings. Further, in the present specification and the drawings, parts having substantially same functional configurations will be assigned same reference numerals, and redundant description thereof will be omitted.

First, a configuration of the wafer processing system according to the present exemplary embodiment will be described. FIG. 1 is a plan view illustrating a schematic configuration of a wafer processing system 1.

Figure 2:
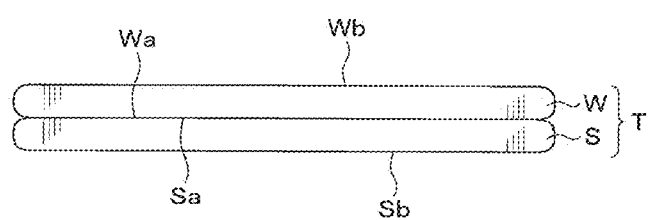
FIG. 2 is a side view illustrating a schematic structure of a combined wafer.
Figure 3:
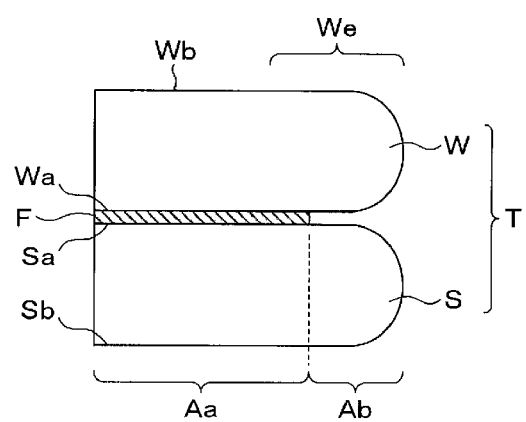
FIG. 3 is a side view illustrating a schematic structure of a part of the combined wafer.

The wafer processing system 1 performs a required processing on a combined wafer T as a combined substrate in which a processing target wafer W as a first substrate and a support wafer S as a second substrate are bonded to each other, as illustrated in FIG. 2 and FIG. 3. In the wafer processing system 1, a peripheral portion We of the processing target wafer W is removed, and the processing target wafer W is thinned. Hereinafter, in the processing target wafer W, a surface bonded to the support wafer S will be referred to as "front surface Wa," and a surface opposite to the front surface Wa will be referred to as "rear surface Wb." Likewise, in the support wafer S, a surface bonded to the processing target wafer W will be referred to as "front surface Sa," and a surface opposite to the front surface Sa will be referred to as "rear surface Sb".

The processing target wafer W is a semiconductor wafer such as, but not limited to, a silicon wafer, and has, on the front surface Wa thereof, a device layer (not shown) including a plurality of devices. Further, an oxide film F, for example, a $SiO_2$ film (TEOS film) is further formed on the device layer. The peripheral portion We of the processing target wafer W is chamfered, and a thickness of the peripheral portion We decreases toward a leading end thereof on a cross section thereof. Here, the peripheral portion We is a portion to be removed by edge trimming and ranges from, e.g., 1 mm to 5 mm from an edge of the processing target wafer W in a diametrical direction thereof.

In FIG. 2, for the sake of simplicity of illustration, illustration of the oxide film F is omitted. In the other drawings recited in the following description, illustration of the oxide film F may sometimes be omitted as well.

The support wafer S is a wafer configured to support the processing target wafer W, and is, for example, a silicon wafer. An oxide film (not shown) is formed on the front surface Sa of the support wafer S. Further, the support wafer S serves as a protection member which protects the devices on the front surface Wa of the processing target wafer W. Further, if the support wafer S has a plurality of devices on the front surface Sa thereof, a device layer (not shown) is formed on the front surface Sa, the same as in the processing target wafer W.

Here, if the processing target wafer W and the support wafer S are bonded at the peripheral portion We of the processing target wafer W, the peripheral portion We may not be removed appropriately. For the reason, at an interface between the processing target wafer W and the support wafer S, a bonding region Aa where the oxide film F and the front surface Sa of the support wafer S are bonded and a non-bonding region Ab are formed. The non-bonding region Ab is located at an outside of the bonding region Aa in the diametrical direction. Since this non-bonding region Ab is provided, the peripheral portion We can be appropriately removed. Further, an outer end portion of the bonding region Aa is located slightly outer than an inner end portion of the peripheral portion We to be removed in the diametrical direction.

As depicted in FIG. 1, the wafer processing system 1 includes a carry-in/out station 2 and a processing station 3 connected as one body. In the carry-in/out station 2, a cassette Ct capable of accommodating therein a multiple number of combined wafers T is carried to/from the outside, for example. The processing station 3 is equipped with various kinds of processing apparatuses configured to perform required processings on the combined wafers T.

A cassette placing table 10 is provided in the carry-in/out station 2. In the shown example, a plurality of, for example, three cassettes Ct can be arranged on the cassette placing table 10 in a row in the Y-axis direction. Further, the number of the cassettes Ct placed on the cassette placing table 10 is not limited to the example of the present exemplary embodiment but can be selected as required.

In the carry-in/out station 2, a wafer transfer device 20 is provided adjacent to the cassette placing table 10 at a negative X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the exemplary embodiment, and various other configurations may be adopted. The wafer transfer device 20 is configured to be capable of transferring the combined wafer T to/from the cassette Ct of the cassette placing table 10 and a transition device 30 to be described later.

In the carry-in/out station 2, the transition device 30 configured to deliver the combined wafer T is provided adjacent to the wafer transfer device 20 at a negative X-axis side of the wafer transfer device 20.

The processing station 3 is provided with, for example, three processing blocks G1 to G3. The first processing block G1, the second processing block G2 and the third processing block G3 are arranged side by side in this sequence from a positive X-axis side (from a carry-in/out station 2 side) toward a negative X-axis side.

The first processing block G1 is equipped with an etching apparatus 40, a cleaning apparatus 41 and a wafer transfer device 50. The etching apparatus 40 and the cleaning apparatus 41 are stacked on top of each other. Further, the number and the layout of the etching apparatus 40 and the cleaning apparatus 41 are not limited to the shown example. By way of example, the etching apparatus 40 and the cleaning apparatus 41 may be elongated in the X-axis direction and arranged side by side when viewed from the top. Further, a plurality of etching apparatuses 40 and a plurality of cleaning apparatuses 41 may be respectively stacked on top of each other.

The etching apparatus 40 is configured to etch the rear surface Wb of the processing target wafer W grounded by a processing apparatus 80 to be described later. By way of example, by supplying a chemical liquid (etching liquid) onto the rear surface Wb, the rear surface Wb is wet-etched. For instance, HF, $HNO_3$, $H_3PO_4$, TMAH, Choline, KOH, or the like may be used.

The cleaning apparatus 41 is configured to clean the rear surface Wb of the processing target wafer W grounded by the processing apparatus 80 to be described later. By way of example, by bringing a brush into contact with the rear surface Wb, the rear surface Wb is scrub-cleaned. Furthermore, a pressurized cleaning liquid may be used for the cleaning of the rear surface Wb. In addition, the cleaning apparatus 41 may be configured to clean the rear surface Sb of the support wafer S as well as the rear surface Wb of the processing target wafer W.

The wafer transfer device 50 is disposed at, for example, a negative Y-axis side of the etching apparatus 40 and the cleaning apparatus 41. The wafer transfer device 50 has, for example, two transfer arms 51 each of which is configured to hold and transfer the combined wafer T. Each transfer arm 51 is configured to be movable in a horizontal direction and a vertical direction and pivotable around a horizontal axis and a vertical axis. Further, the configuration of the transfer arm 51 is not limited to the exemplary embodiment, and various other configurations may be adopted. Additionally, the wafer transfer device 50 is configured to be capable of transferring the combined wafer T to/from the transition device 30, the etching apparatus 40, the cleaning apparatus 41 and a modifying apparatus 60 to be described later.

The second processing block G2 is equipped with the modifying apparatus 60, a periphery removing apparatus 61 and a wafer transfer device 70. The modifying apparatus 60 and the periphery removing apparatus 61 are stacked on top of each other. Further, the number and the layout of the modifying apparatus 60 and the periphery removing apparatus 61 are not limited to the example of the present exemplary embodiment.

The modifying apparatus 60 is configured to form a peripheral modification layer, a split modification layer and an internal modification layer by radiating laser light to an inside of the processing target wafer W. A specific configuration of the modifying apparatus 60 will be elaborated later.

The periphery removing apparatus 61 is configured to remove the peripheral portion We of the processing target wafer W, starting from the peripheral modification layer formed by the modifying apparatus 60. A specific configuration of the periphery removing apparatus 61 will be elaborated later.

The wafer transfer device 70 is disposed at, for example, a positive Y-axis side of the modifying apparatus 60 and the periphery removing apparatus 61. The wafer transfer device 70 is equipped with, for example, two transfer arms 71 each of which is configured to hold and transfer the combined wafer T. Each transfer arm 71 is supported at a multi-joint arm member 72 and configured to be movable in a horizontal direction and a vertical direction and pivotable around a horizontal axis and a vertical axis. A specific configuration of the transfer arm 71 will be elaborated later. The wafer transfer device 70 is configured to be capable of transferring the combined wafer T to/from the cleaning apparatus 41, the modifying apparatus 60, the periphery removing apparatus 61 and the processing apparatus 80 to be described later.

The third processing block G3 is equipped with the processing apparatus 80. The number and the layout of the processing apparatus 80 is not limited to the example of the present exemplary embodiment, and a plurality of processing apparatuses 80 may be arranged as required.

The processing apparatus 80 is configured to grind the rear surface Wb of the processing target wafer W. Further, the processing apparatus 80 is configured to remove, in the rear surface Wb having the internal modification layer formed therein, the corresponding internal modification layer, and also removes the peripheral modification layer.

The processing apparatus 80 has a rotary table 81. The rotary table 81 is configured to be rotated around a vertical rotation center line 82 by a rotating mechanism (not shown). Two chucks 83 each configured to attract and hold the combined wafer T are provided on the rotary table 81. The chucks 83 are arranged on a circle concentric with the rotary table 81 at a regular distance therebetween. The two chucks 83 are configured to be moved to a delivery position A0 and a processing position B0 as the rotary table 81 is rotated. Further, each of the two chucks 83 is configured to be rotated around a vertical axis by a rotating mechanism (not shown).

At the delivery position A0, delivery of the combined wafer T is performed. The grinding unit 84 is provided at the processing position B0. In the grinding unit 84, the rear surface Wb of the processing target wafer W is ground. The grinding unit 84 is equipped with a grinder 85 having a grinding whetstone (not shown) configured to be rotated in a ring shape. Further, the grinder 85 is configured to be moved in a vertical direction along a supporting column 86. By respectively rotating the chuck 83 and the grinding whetstone while keeping the rear surface Wb of the processing target wafer W held by the chuck 83 in contact with the grinding whetstone, the rear surface Wb is ground.

The above-described wafer processing system 1 is equipped with a control device 90 as a controller. The control device 90 is implemented by, for example, a computer, and includes a program storage (not shown). A program for controlling a processing of the combined wafer T in the wafer processing system 1 is stored in the program storage. Further, the program storage also stores therein a program for implementing a wafer processing to be described later in the wafer processing system 1 by controlling the above-described various processing apparatuses and a driving system such as the transfer devices. Further, the programs may be recorded in a computer-readable recording medium H, and may be installed from this recording medium H to the control device 90.

Figure 4:
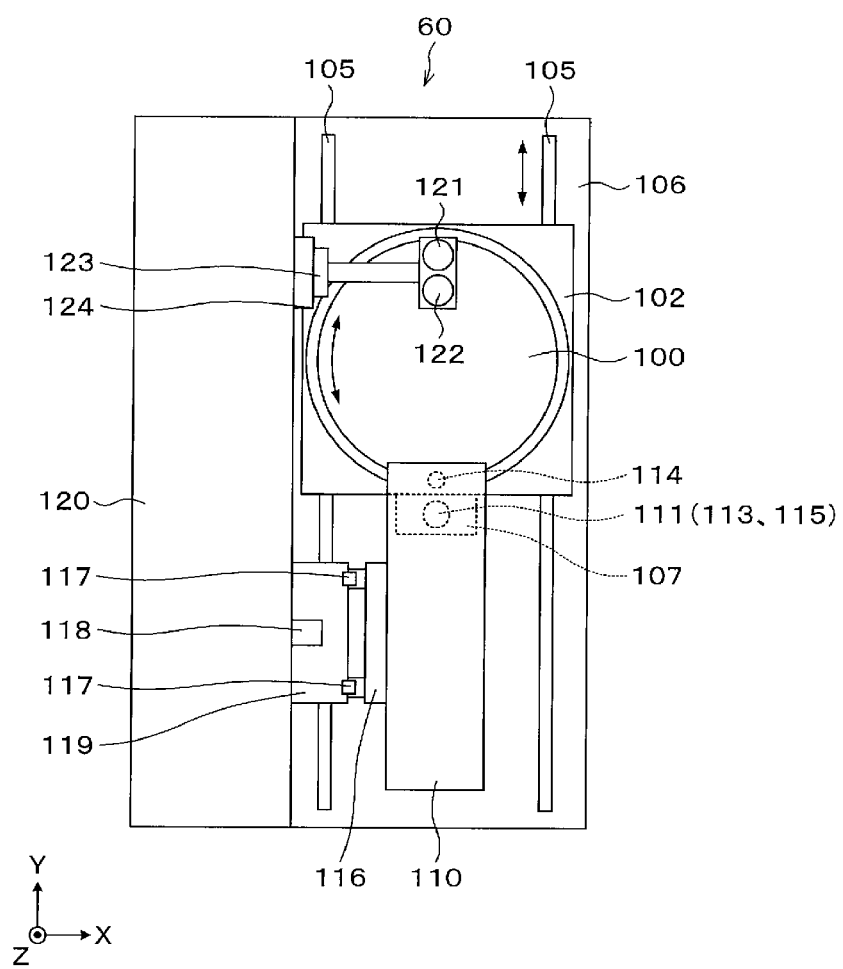
FIG. 4 is a plan view illustrating a schematic configuration of a modifying apparatus.
Figure 5:
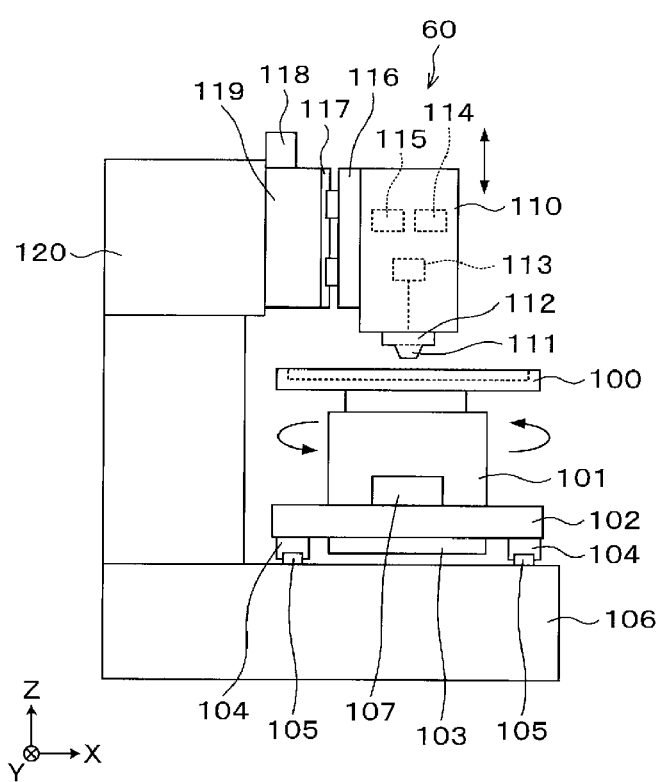
FIG. 5 is a side view illustrating the schematic configuration of the modifying apparatus.

Now, the aforementioned modifying apparatus 60 will be described. FIG. 4 is a plan view illustrating a schematic configuration of the modifying apparatus 60. FIG. 5 is a side view illustrating the schematic configuration of the modifying apparatus 60.

The modifying apparatus 60 is equipped with a chuck 100 as a holder configured to hold the combined wafer W on a top surface thereof. The chuck 100 is configured to attract and hold the support wafer S in the state that the processing target wafer W is placed at an upper side and the support wafer S is placed at a lower side. The chuck 100 is supported on a slider table 102 with an air bearing 101 therebetween. A rotating mechanism 103 is provided at a bottom surface side of the slider table 102. The rotating mechanism 103 incorporates therein, for example, a motor as a driving source. The chuck 100 is configured to be rotated around a vertical axis by the rotating mechanism 103 via the air bearing 101 therebetween. The slider table 102 is configured to be moved by a moving mechanism 104, which is provided at a bottom surface side thereof, along a rail 105 which is provided on a base 106 and elongated in the Y-axis direction. Further, though not particularly limited, a driving source of the moving mechanism 104 may be, for example, a linear motor.

A power meter 107 configured to measure an output (power) of laser light radiated from a laser head 110 to be described layer is provided at the slider table 102. The power meter 107 is provided at a negative Y-axis end portion of the slider table 102. At a first position P1, the power meter 107 is disposed under a lens of the laser head 110, as will be described later. The power of the laser light measured by the power meter 107 is outputted to the control device 90. A power of the laser light according to a processing recipe is set in the control device 90, and the control device 90 determines whether the measured power of the laser light is appropriate (power check). This power check is performed for, for example, every processing target wafer W as a processing target.

The laser head 110 as a modifying device is provided above the chuck 100. The laser head 110 includes a lens 111 and a piezo actuator 112. The lens 111 is provided on a bottom surface of the laser head 110 and is configured to radiate the laser light to the processing target wafer W held on the chuck 100. The piezo actuator 112 is configured to move the lens 111 up and down.

Further, the laser head 110 is also equipped with a sensor 113 as a measuring device configured to measure a position of the laser light radiated from the lens 111. The sensor 113 is disposed coaxially with respect to the laser light radiated from the lens 111. The sensor 113 may be, for example, an AF sensor, and measures a height of the rear surface Wb of the processing target wafer W. The height of the rear surface Wb measured by the sensor 113 is outputted to the control device 90. In the control device 90, the radiation position of the laser light radiated to an inside of the processing target wafer W is calculated based on the height of the rear surface Wb.

Further, the laser head 110 is further equipped with a sensor 114 as a first adjuster and a camera 115 as a second adjuster configured to adjust the radiation position (focal point) of the laser light radiated from the lens 111. The sensor 114 is provided on a separate axis from the laser light radiated from the lens 111. This sensor 114 is, for example, an AF sensor, and it searches for the rear surface Wb of the processing target wafer W by measuring the height of the rear surface Wb. Further, an AF sensor capable of measuring a wider range than the sensor 113 is used as the sensor 114. Further, the camera 115 is disposed coaxially with respect to the laser light radiated from the lens 111, and is configured to image the rear surface Wb of the processing target wafer W. The height of the rear surface Wb measured by the sensor 114 and the image of the rear surface Wb obtained by the camera 115 are outputted to the control device 90. In the control device 90, the radiation position of the laser light radiated to the inside of the processing target wafer W is calculated based on the height and the image of the rear surface Wb, as will be described later.

Furthermore, the laser head 110 is further equipped with a non-illustrated spatial light modulator. The spatial light modulator is configured to modulate the laser light and output the modulated laser light. Specifically, the spatial light modulator is capable of controlling a focal point or a phase of the laser light, thus allowing the shape or the number (branch number) of the laser light radiated to the processing target wafer W to be adjusted.

The laser head 110 concentrates and radiates the laser light having a wavelength featuring transmissivity for the processing target wafer W to required positions within the processing target wafer W as high-frequency laser light in a pulse shape oscillated from a laser light oscillator (not shown). Accordingly, portions within the processing target wafer W to which the laser light is concentrated are modified, so that the peripheral modification layer, the split modification layer and the internal modification layer are formed.

The laser head 110 is supported at a supporting member 116. The laser head 110 is configured to be moved up and down by an elevating mechanism 118 along a vertically elongated rail 117. Further, the laser head 110 is configured to be moved in the Y-axis direction by a moving mechanism 119. Each of the elevating mechanism 118 and the moving mechanism 119 is supported at a supporting column 120.

Above the chuck 100, a macro-camera 121 as a first imaging device and a micro-camera 122 as a second imaging device are provided at a positive Y-axis side of the laser head 110. For example, the macro-camera 121 and the micro-camera 122 are formed as one body, and the macro-camera 121 is provided at a positive Y-axis side of the micro-camera 122. The macro-camera 121 and the micro-camera 122 are configured to be moved up and down by an elevating mechanism 123, and also configured to be moved in the Y-axis direction by a moving mechanism 124.

The macro-camera 121 serves to image an outer end portion of the processing target wafer W (combined wafer T). The macro-camera 121 is equipped with, for example, a coaxial lens, and radiates visible light, for example, red light and receives reflection light from a target object. For example, the macro-camera 121 has an image magnification of two times.

The micro-camera 122 serves to image a peripheral portion of the processing target wafer W, and also images a boundary between the bonding region Aa and the non-bonding region Ab. The micro-camera 122 is equipped with, for example, a coaxial lens, and radiates infrared light (IR light) and receives reflection light from a target object. By way of example, the micro-camera 122 has an image magnification of 10 times. A field of view of the micro-camera 122 is about ⅕ of a field of view of the macro-camera 121, and a pixel size of the micro-camera 122 is about ⅕ of a pixel size of the macro-camera 121.

In the present exemplary embodiment, the rotating mechanism 103, the moving mechanism 104, the elevating mechanism 123 and the moving mechanism 124 constitute a first moving device according to the present disclosure. Further, the rotating mechanism 103, the moving mechanism 104, the piezo actuator 112, the elevating mechanism 118 and the moving mechanism 119 constitute a second moving device according to the present disclosure.

Now, the aforementioned periphery removing apparatus 61 will be explained.

Figure 6:
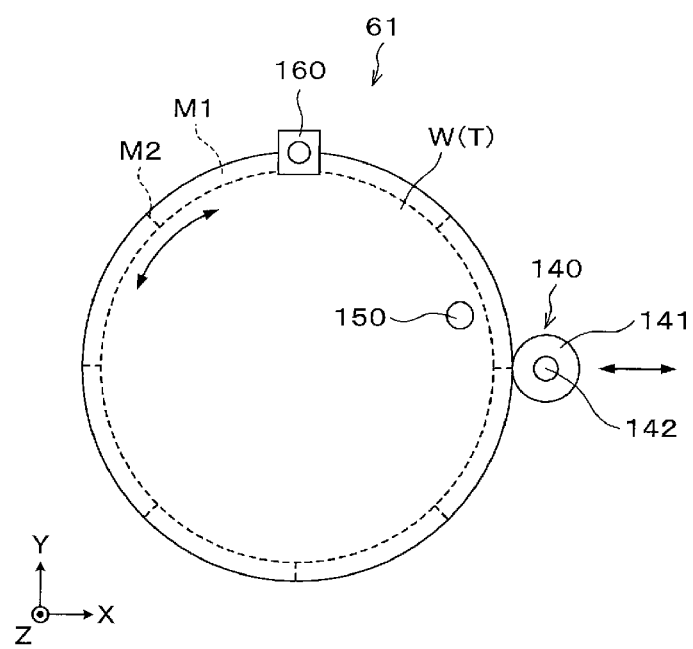
FIG. 6 is a plan view illustrating a schematic configuration of a periphery removing apparatus.
Figure 7:
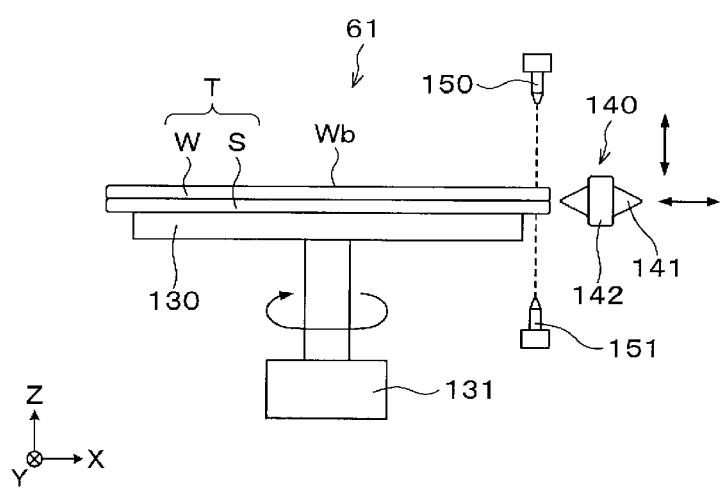
FIG. 7 is a side view illustrating the schematic configuration of the periphery removing apparatus.
Figure 8:
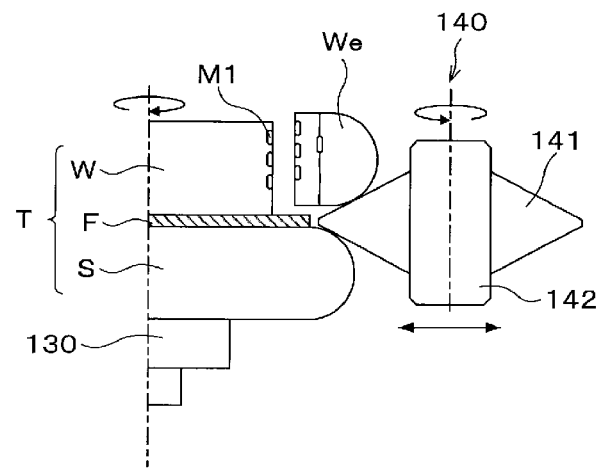
FIG. 8 is an explanatory diagram illustrating the schematic configuration of the periphery removing apparatus.

FIG. 6 is a plan view illustrating a schematic configuration of the periphery removing apparatus 61. FIG. 7 is a side view illustrating the schematic configuration of the periphery removing apparatus 61. FIG. 8 is an explanatory diagram illustrating the schematic configuration of the periphery removing apparatus 61.

The periphery removing apparatus 61 is equipped with a chuck 130 configured to hold the combined wafer T on a top surface thereof. The chuck 130 holds the support wafer S in the state that the processing target wafer W is placed at the upper side and the support wafer S is placed at the lower side. Further, the chuck 130 is configured to be rotated around a vertical axis by a rotating mechanism 131.

By the chuck 130, there is provided a periphery remover 140 configured to remove the peripheral portion We of the processing target wafer W. The periphery remover 140 removes the peripheral portion We by applying impact to the peripheral portion We. The periphery remover 140 includes a wedge roller 141 and a support roller 142.

When viewed from the side, a leading end of the wedge roller 141 has a pointed wedge shape. The wedge roller 141 is inserted into an interface between the processing target wafer W and the support wafer S from outer ends of the processing target wafer W and the support wafer S. The peripheral portion We is lifted up by the inserted wedge roller 141, and is separated and removed from the processing target wafer W.

The support roller 142 penetrates the center of the wedge roller 141 and supports the wedge roller 141. The support roller 142 is configured to be moved in horizontal directions by a moving mechanism (not shown). As the support roller 142 is moved, the wedge roller 141 is also moved. Further, the support roller 142 is configured to be rotated around a vertical axis. As the support roller 142 is rotated, the wedge roller 141 is also rotated. Further, in the present exemplary embodiment, a so-called free roller which is rotated by the rotation of the chuck 130 as will be described later is used as the support roller 142. However, the support roller 142 may be rotated actively by a rotating mechanism (not shown).

Furthermore, in the present exemplary embodiment, although the wedge roller 141 is used as an insertion member, the insertion member is not limited thereto. By way of example, any member the width of which decreases as it goes outwards in a diametrical direction when viewed from the side may be used as the insertion member. For example, a knife-shaped insertion member with a point leading end may be used.

Nozzles 150 and 151 for supplying a cleaning liquid to the processing target wafer W are provided above and under the chuck 130, respectively. The cleaning liquid may be, for example, pure water. If the peripheral portion We is removed by applying the impact to the peripheral portion We using the periphery remover 140, dust (particle) may be generated. In view of this, in the present exemplary embodiment, scattering of the dust is suppressed by supplying the cleaning liquid from the nozzles 150 and 151.

The upper nozzle 150 is disposed above the chuck 130 and serves to supply the cleaning liquid to the rear surface Wb of the processing target wafer W from thereabove. The cleaning liquid from this upper nozzle 150 suppresses the dust generated when removing the peripheral portion We from being scattered around, particularly, from being scattered onto the processing target wafer W. To elaborate, the cleaning liquid makes the dust flown to an edge side of the processing target wafer W. Further, the lower nozzle 151 is disposed under the chuck 130 and serves to supply the cleaning liquid to the processing target wafer W from the support wafer S side. The cleaning liquid from this lower nozzle 151 may suppress more securely the dust from being scattered around. Further, the cleaning liquid from the lower nozzle 151 also serves to suppress the dust and broken pieces of the peripheral portion We from reaching the support wafer S.

Further, the number and the layout of the nozzles 150 and 151 are not limited to the example of the present exemplary embodiment. For example, a plurality of nozzles 150 and a plurality of nozzles 151 may be provided. Moreover, the lower nozzle 151 may be omitted.

Here, the way how to suppress the scattering of the dust is not limited to supplying the cleaning liquid. For instance, the produced dust may be removed by suctioning, using a suction mechanism (not shown).

A detector 160 is provided above the chuck 130 to detect whether the peripheral portion We is removed from the processing target wafer W. The detector 160 detects presence or absence of the peripheral portion We in the processing target wafer W which is held by the chuck 130 and from which the peripheral portion We is removed. By way of example, a sensor may be used as the detector 160. The sensor may be, by way of non-limiting example, a line type laser displacement meter, and it detects the presence or absence of the peripheral portion We by radiating laser to the peripheral portion of the combined wafer T (processing target wafer W) and measuring a thickness of the combined wafer T. However, the way how to detect the presence or absence of the peripheral portion We by the detector 160 is not limited thereto. For example, the detector 160 may detect the presence or absence of the peripheral portion We by imaging the combined wafer T (processing target wafer W) with, for example, a line camera.

Further, a collector (not shown) configured to collect the peripheral portion We removed by the periphery remover 140 is provided under the chuck 130.

Figure 9:
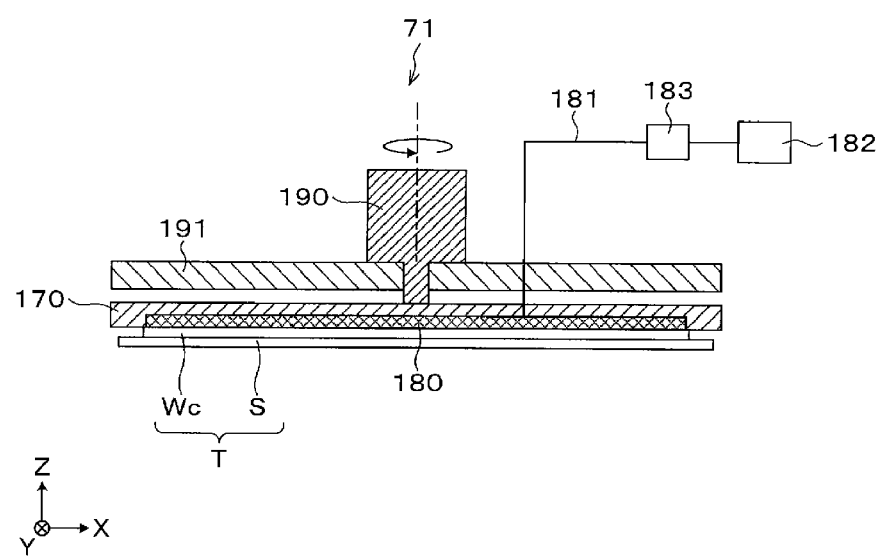
FIG. 9 is a longitudinal cross sectional view illustrating a schematic configuration of a transfer arm.

Now, the transfer arm 71 of the aforementioned wafer transfer device 70 will be explained. FIG. 9 is a longitudinal cross sectional view illustrating a schematic configuration of the transfer arm 71.

The transfer arm 71 is equipped with a circular attraction plate 170 having a diameter larger than a diameter of the combined wafer T. A holder 180 configured to hold the central portion We of the processing target wafer W is provided in a bottom surface of the attraction plate 170.

A suction line 181 for suctioning the central portion We is connected to the holder 180, and the suction line 181 is connected to a suction mechanism 182 such as, but not limited to, a vacuum pump. The suction line 181 is provided with a pressure sensor 183 configured to measure a suction pressure. Though a configuration of the pressure sensor 183 is not particularly limited, a diaphragm pressure sensor may be used.

A rotating mechanism 190 configured to rotate the attraction plate 170 around a vertical axis is provided on a top surface of the attraction plate 170. The rotating mechanism 190 is supported at a supporting member 191. Further, the supporting member 191 (rotating mechanism 190) is supported at the arm member 72.

Figure 10:
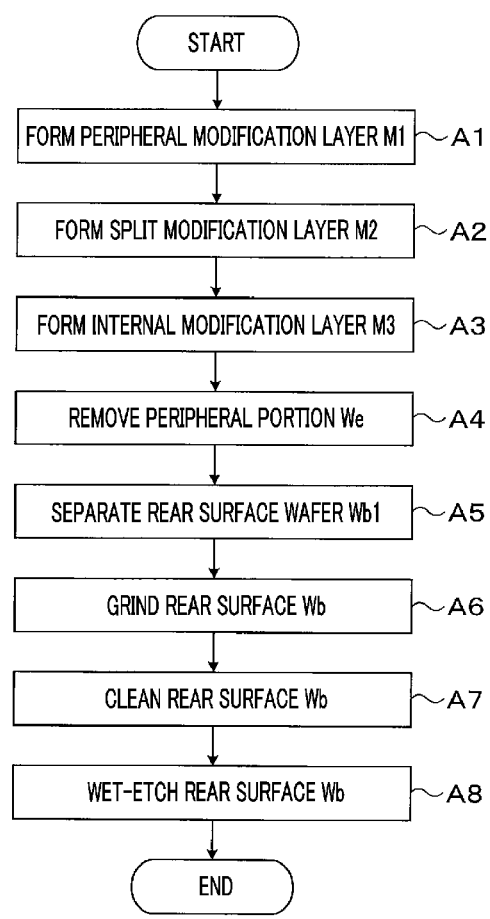
FIG. 10 is a flowchart illustrating main processes of a wafer processing according to the exemplary embodiment.

Now, a wafer processing performed by using the wafer processing system 1 configured as described above will be discussed. FIG. 10 is a flowchart illustrating main processes of the wafer processing. FIG. 11A to FIG. 11F are explanatory diagrams illustrating the main processes of the wafer processing. In the present exemplary embodiment, the combined wafer T is previously formed by bonding the processing target wafer W and the support wafer S in a bonding apparatus (not shown) at the outside of the wafer processing system 1.

Figure 11A:
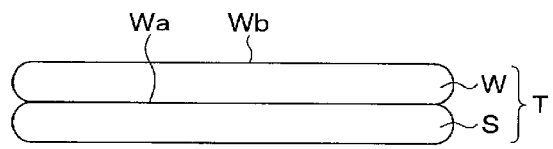
FIG. 11A to FIG. 11F are explanatory diagrams illustrating the main processes of the wafer processing according to the exemplary embodiment.

First, the cassette Ct accommodating therein the multiple number of combined wafers T shown in FIG. 11A is placed on the cassette placing table 10 of the carry-in/out station 2.

Figure 11B:
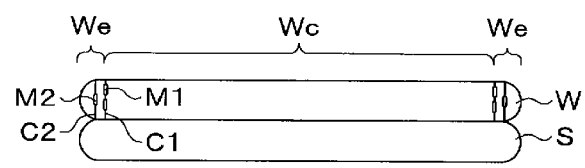
Figure 11C:
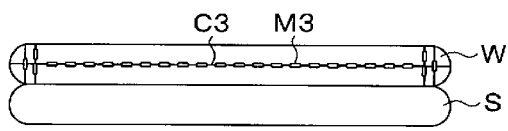

Then, the combined wafer T is taken out of the cassette Ct by the wafer transfer device 20, and transferred into the transition device 30. Subsequently, the combined wafer T is taken out of the transition device 30 by the wafer transfer device 50, and transferred into the modifying apparatus 60. In the modifying apparatus 60, a peripheral modification layer M1 and a split modification layer M2 are formed inside the processing target wafer W in sequence as illustrated in FIG. 11B (processes A1 and A2 of FIG. 10), and, also, an internal modification layer M3 is formed as illustrated in FIG. 11C (process A3 of FIG. 10). The peripheral modification layer M1 serves as a starting point when the peripheral portion We is removed in the edge trimming. The split modification layer M2 serves as a starting point when the peripheral portion We to be removed is broken into smaller pieces. The internal modification layer M3 serves as a starting point for thinning the processing target wafer W.

Figure 12:
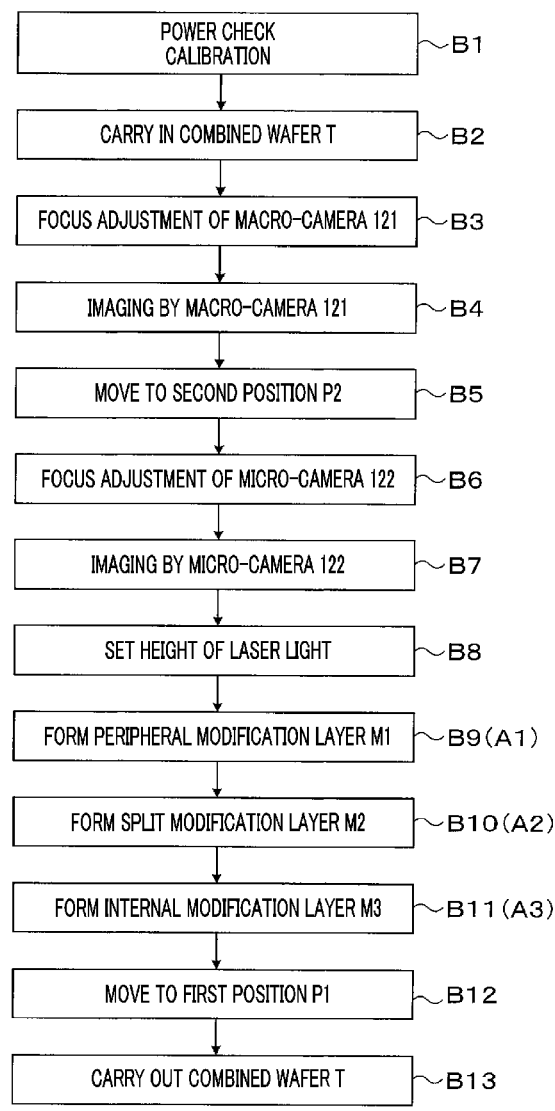
FIG. 12 is a flowchart illustrating main processes of a modifying processing.

FIG. 12 is a flowchart illustrating main processes of a modifying processing performed by the modifying apparatus 60. FIG. 13A to FIG. 13D are explanatory diagrams illustrating the main processes of the modifying processing. In the present exemplary embodiment, the chuck 100 is placed at the first position P1 and the second position P2 to be subjected to the respective processes, as illustrated in FIG. 13A to FIG. 13D.

Figure 13A:
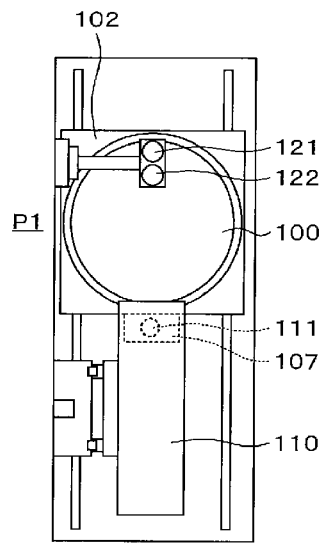
FIG. 13A to FIG. 13D are explanatory diagrams illustrating the main processes of the modifying processing.

In the modifying apparatus 60, before the combined wafer T is carried in, the chuck 100 (slider table 102) is moved to and stands by at the first position P1, as shown in FIG. 13A. During the standby of the chuck 100, the power meter 107 is placed under the lens 111 of the laser head 110. The power meter 107 measures the output (power) of the laser light radiated from the laser head 110. The power of the laser light measured by the power meter 107 is outputted to the control device 90, and the power check is carried out in the control device 90. Further, during the standby of the chuck 100, the calibration of the optical system of the laser head 110 is also performed (process B1 of FIG. 12).

Here, if, for example, the power meter 107 is located at a position distanced apart from the first position P1, the chuck 100 needs to be moved from the first position P1 to carry out the power check, which results in scale-up of the apparatus. In the present exemplary embodiment, however, since the power meter 107 is disposed under the laser head 110 at the first position, the power check can be carried out without having to move the chuck 100. As a result, an occupation area (footprint) of the modifying apparatus 60 can be reduced, so that the space can be saved. Further, since the power check and the calibration can be performed during the standby of the chuck 100, a modifying processing time can be shortened, so that the throughput of the wafer processing can be improved. Moreover, the power check and the calibration may be performed when the combined wafer T is carried in in a subsequent process B2 to be described below.

Figure 13B:
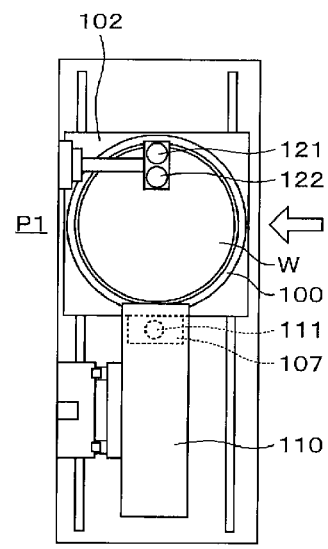

Then, with the chuck 100 located at the first position as shown in FIG. 13B, the combined wafer T is carried in from the wafer transfer device 50 (process B2 of FIG. 12). The carried combed wafer T is held on the chuck 100.

Thereafter, in the state that the chuck 100 is located at the first position P1, macro-alignment is performed by using the macro-camera 121. At the first position P1, the macro-camera 121 is disposed at a position where it is capable of imaging the outer end portion of the processing target wafer W. In the macro-alignment, the outer end of the processing target wafer W is imaged (process B4 of FIG. 12) after focus adjustment of the macro-camera 121 is first performed (process B3 of FIG. 12).

First, in the process B3, the focus adjustment of the macro-camera 121 is performed for multiple points in a height direction of the processing target wafer W. At this time, the chuck 100 is not rotated. Then, by moving the macro-camera 121 up or down with the elevating mechanism 123, the focus adjustment of the processing target wafer W is performed for the multiple points in the height direction of the processing target wafer W.

The focus adjustment according to the present exemplary embodiment will be discussed. FIG. 14A and FIG. 14B are explanatory diagrams showing timings for performing the focus adjustment with respect to the moving-up/down of the macro-camera 121. In each drawing, a vertical axis represents a moving-up/down speed, and a horizontal axis represents time. Q1 to Q4 in FIG. 14A and FIG. 14B indicate the first to the fourth focus adjustment, respectively. Further, FIG. 14A shows a comparative example, and FIG. 14B shows an example of the present exemplary embodiment.

In the comparative example shown in FIG. 14A, the focus adjustments Q1 to Q4 are performed in the state that the macro-camera 121 is stopped at a required height after it is moved up or down. That is, whenever the macro-camera 121 is moved up and down, acceleration and deceleration are repeated. Further, for the respective focus adjustments Q1 to Q4, it is determined whether focus values are appropriate. Thus, it takes time to accomplish these focus adjustments.

In contrast, in the present exemplary embodiment shown in FIG. 14B, the focus adjustments Q1 to Q4 are performed while moving the macro-camera 121 up and down. That is, the macro-camera 121 is not stopped when the focus adjustments are performed. Accordingly, the acceleration and the deceleration performed in the comparative example are not necessary, and time can be saved. Further, since the appropriateness of the focus values in the focus adjustments Q1 and Q4 can be determined all together, the time taken for the focus adjustments can be further reduced. In the example of FIG. 14A and FIG. 14B, t1 denotes the time that can be reduced.

Subsequently, in the process B4, the outer end portion of the processing target wafer W is imaged for multiple points in a circumferential direction of the processing target wafer W. At this time, the macro-camera 121 is not moved up or down but is fixed. Then, while rotating the chuck 100, an outer end portion R1 (indicated by a dashed line in FIG. 15) of the processing target wafer W is imaged for the multiple points in the circumferential direction of the processing target wafer W, as shown in FIG. 15.

In imaging the outer end portion of the processing target wafer W, the imaging is performed in the comparative example in the state that the chuck 100 is stopped at a required position after it is rotated, the same as in the focus adjustment shown in FIG. 14A and FIG. 14B. In contrast, in the present exemplary embodiment, the outer end portion of the processing target wafer W is imaged while rotating the chuck 100. That is, when the imaging is performed, the rotation of the chuck 100 is not stopped. Therefore, time taken for the imaging can be reduced. Further, if the time taken for the imaging is reduced as stated above, the repetition number of the imaging can be increased, so that the macro-alignment can be carried out appropriately.

In this way, the outer end portion R1 of the processing target wafer W is imaged by the macro-camera 121 in 360 degrees in the circumferential direction of the processing target wafer W. The obtained image is outputted to the control device 90 from the macro-camera 121.

In the control device 90, a first eccentric amount between a center Cc of the chuck 100 and a center Cw of the processing target wafer W is calculated from the image obtained by the macro-camera 121. Further, in the control device 90, a moving amount of the chuck 100 is calculated based on the first eccentric amount to correct a Y-axis component of the first eccentric amount. The chuck 100 is moved in the Y-axis direction based on the calculated moving amount, and then moved to a micro-alignment position. The micro-alignment position is a position where the micro-camera 122 is capable of imaging the peripheral portion of the processing target wafer W. Here, the field of view of the micro-camera 122 is smaller (about ⅕) than the field of view of the macro-camera 121, as stated above. Thus, if the Y-axis component of the first eccentric amount is not corrected, the peripheral portion of the processing target wafer W may not be included in an angle of view of the micro-camera 122, resulting in a failure to image the peripheral portion of the processing target wafer W with the micro-camera 122. For the reason, the correction of the Y-axis component based on the first eccentric amount is performed to move the chuck 100 to the micro-alignment position.

Further, in the macro-alignment using the macro-camera 121, adjustment of light amount is also performed prior to the focus adjustment. This light amount adjustment may be performed for each combined wafer T, each lot or each processing condition (processing recipe). The light amount adjustment is performed for a single point or multiple points of the processing target wafer W. In such a case, the light amount adjustment is performed in the state that the rotation of the chuck 100 is stopped. While the rotation of the chuck 100 is stopped, the imaging is performed while varying the light amount multiple times.

Although the macro-alignment is performed to move the chuck 100 to the micro-alignment position as stated above, this macro-alignment may be omitted. That is, if the alignment is not performed in two stages including the macro-alignment and micro-alignment but is performed in only one stage of the micro-alignment, the macro-alignment may be omitted.

Figure 13C:
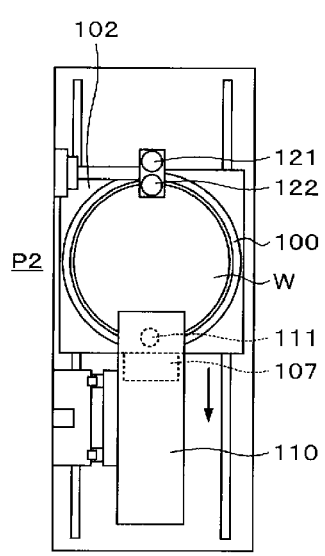

Subsequently, as shown in FIG. 13C, the chuck 100 is moved to the second position P2 (process B5 of FIG. 12).

Then, in the state that the chuck 100 is placed at the second position P2, the micro-alignment is performed by using the micro-camera 122. At the second position P2, the micro-camera 122 is located at a position where it is capable of imaging the boundary between the bonding region Aa and the non-bonding region Ab of the processing target wafer W. In the micro-alignment, the boundary between the bonding region Aa and the non-bonding region Ab is imaged (process B7 of FIG. 12) after focus adjustment of the micro-camera 122 is first performed (process B6 of FIG. 12).

First, in the process B6, the focus adjustment of the micro-camera 122 is performed for multiple points in the height direction of the processing target wafer W. The focus adjustment of the micro-camera 122 is performed while moving the micro-camera 122 up and down with the elevating mechanism 123. Thus, time taken for the focus adjustment can be reduced. Since the focus adjustment of the micro-camera 122 is the same as the focus adjustment of the macro-camera 121 in the process B3, redundant description will be omitted.

Figure 16:
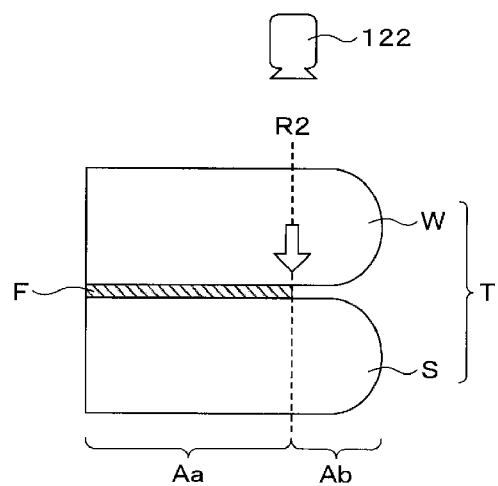
FIG. 16 is an explanatory diagram illustrating a state in which the micro-camera images a boundary between a bonding region and a non-bonding region of the processing target wafer.

Then, in the process B7, the boundary between the bonding region Aa and the non-bonding region Ab of the processing target wafer W is imaged for multiple points in the circumferential direction of the processing target wafer W. At this time, the micro-camera 122 is not moved up and down but is fixed. Then, while rotating the chuck 100, a boundary R2 (indicated by a dashed line in FIG. 16) between the bonding region Aa and the non-bonding region Ab is imaged for the multiple points in the circumferential direction of the processing target wafer W, as shown in FIG. 16.

In imaging the boundary between the bonding region Aa and the non-bonding region Ab, the imaging is performed in the comparative example in the state that the chuck 100 is stopped at a required position after being rotated, the same as in the imaging of the outer end portion of the processing target wafer W in the process B3. In contrast, in the present exemplary embodiment, the boundary between the bonding region Aa and the non-bonding region Ab is imaged while rotating the chuck 100. That is, when the imaging is performed, the rotation of the chuck 100 is not stopped. Accordingly, time taken for the imaging can be reduced. Further, if the time taken for the imaging is reduced, the repetition number of the imaging can be increased, so that the micro-alignment can be carried out appropriately.

In this way, the boundary between the bonding region Aa and the non-bonding region Ab is imaged by the micro-camera 122 in 360 degrees in the circumferential direction of the processing target wafer W. The obtained image is outputted to the control device 90 from the micro-camera 122.

In the control device 90, a second eccentric amount between the center Cc of the chuck 100 and a center Ca of the bonding region Aa is calculated from the image obtained by the micro-camera 122. Further, in the control device 90, a position of the chuck 100 with respect to the peripheral modification layer M1 is decided based on the second eccentric amount such that the center of the bonding region Aa and the center of the chuck 100 are aligned with each other.

Then, in the state that the chuck 100 is located at the second position P2, height adjustment (radiation height adjustment) of the laser light radiated from the laser head 110 is carried out (process B8 of FIG. 12). At the second position P2, the lens 111 of the laser head 110 is located at a position where it is capable of radiating the laser light to a boundary between the peripheral portion We and the central portion We of the processing target wafer W.

Here, as will be described later, in a process B9, by radiating the laser light to an inside of the processing target wafer W from the laser head 110 while rotating the chuck 100, an annular peripheral modification layer is formed. In the process B9, by measuring a radiation position (radiation height) of the laser light, height of the radiation light is adjusted (followed) in real time. For the reason, the height of the laser light at a radiation start position where the radiation of the laser light is begun is important. Thus, the adjustment of the radiation height of the laser light in the process B8 is performed at the radiation start position of the laser light in the process B9.

Further, the height of the processing target wafer W held on the chuck 100 may not be uniform within the surface of the processing target wafer W due to various factors. If so, the height of the processing target wafer W may differ between the peripheral portion and the central portion thereof. In such a case, if the height of the laser light is adjusted at, for example, the center of the processing target wafer W, the height of the laser light at the peripheral portion of the processing target wafer W may not be adjusted appropriately. Thus, even from this point of view, it is desirable that the adjustment of the radiation height of the laser light in the process B8 is performed at the radiation start position of the laser light in the process B9.

Further, the sensor 113 used to measure the radiation position of the laser light in the process B9 has a limited sensing range, and this range may be, for example, ±0.2 mm in a vertical direction from the rear surface Wb of the processing target wafer W as a measurement target. Thus, the radiation height adjustment of the process B8 needs to be performed to put the radiation position of the laser light in the process B9 within the sensing range of the sensor 113.

In the process B8, the sensor 114 and the camera 115 are first moved to the radiation start position of the laser light in the process B9. Then, while moving the laser head 110 up and down, the rear surface Wb of the processing target wafer W is searched for by way of measuring, with the sensor 114, the height of the rear surface Wb of the processing target wafer W at the radiation start position of the laser light. The height of the rear surface Wb measured by the sensor 114 is outputted to the control device 90. In the control device 90, a position of the rear surface Wb is searched for (specified) based on the height of the rear surface Wb.

In the process B8, the laser head 110 is then horizontally moved to the radiation position of the laser light in the process B9. Then, the rear surface Wb is imaged by the camera 115. The image of the rear surface Wb obtained by the camera 115 is outputted to the control device 90. In the control device 90, the height of the rear surface Wb is calculated based on the image of the rear surface Wb, and the radiation position of the laser light radiated to the inside of the processing target wafer W is calculated based on the calculated height of the rear surface Wb. Thereafter, after lowering the laser head 110 and placing it at the radiation height of the laser light, the calculated radiation position is set as an origin position of the radiation position of the laser light for the sensor 113 (zero point adjustment). As stated above, in the process B8, after roughly searching for the rear surface Wb by the sensor 114, the rear surface Wb is precisely found by the camera 115, and the zero point adjustment is performed.

Furthermore, in the process B8, the zero point adjustment is performed by using the sensor 114 and the camera 115 while moving the laser head 110 up or down. Here, the same as in the focus adjustment described in FIG. 14A and FIG. 14B, if the height of the rear surface Wb is measured by the sensor 114 in the state that the laser head 110 is stopped at a required height after its vertical movement is stopped, it would take time to carry out the zero point adjustment. In contrast, in the present exemplary embodiment, the measurement by the sensor 114 is performed while moving the laser head 110 up and down. That is, the vertical movement of the laser head 110 is not stopped when the measurement by the sensor 114 is performed. Thus, time taken for the zero point adjustment can be shortened. Likewise, if the imaging of the rear surface Wb by the camera 115 is performed in the state that the laser head 110 is placed at a required height after its vertical movement is stopped, it would take time to carry out the zero point adjustment. In contrast, according to the present exemplary embodiment, by imaging the rear surface Wb with the camera 115 while moving the laser head 110 up and down, the time taken for the zero point adjustment can be reduced.

Figure 17:
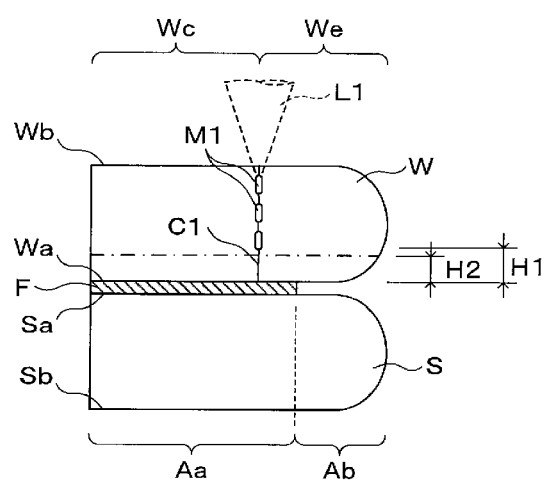
FIG. 17 is an explanatory diagram showing a state in which a peripheral modification layer is being formed in the processing target wafer.
Figure 18:
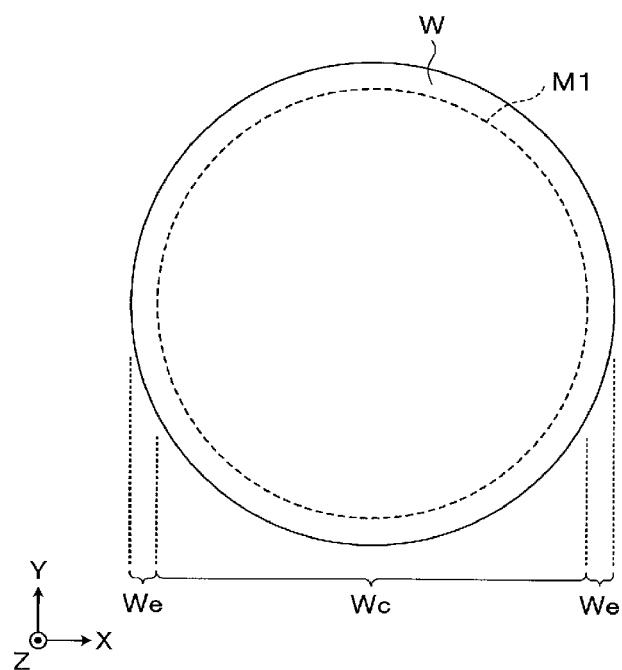
FIG. 18 is an explanatory diagram showing a state in which the peripheral modification layer is formed in the processing target wafer.

Thereafter, the sensor 113 is moved to the radiation start position of the laser light. Then, as shown in FIG. 17 and FIG. 18, laser light L1 (laser light L1 for periphery) is radiated from the laser head 110, so that the peripheral modification layer M1 is formed at the boundary between the peripheral portion We and the central portion We of the processing target wafer W (process B9 of FIG. 12, process A1 of FIG. 10). Here, the peripheral modification layer M1 is plural in number, and these multiple peripheral modification layers M1 are formed at different heights. Further, these peripheral modification layers M1 are formed at an inner side than an outer end of the bonding region Aa in a diametrical direction.

The peripheral modification layer M1 formed by the laser light L1 is elongated in a thickness direction and has an aspect ratio with a vertically longer side. A lower end of the bottommost peripheral modification layer M1 is located above a target surface (indicated by a dashed line in FIG. 17) of the processing target wafer W after being thinned. That is, a distance H1 between the lower end of the peripheral modification layer M1 and the front surface Wa of the processing target wafer W is slightly larger than a target thickness H2 of the processing target wafer W after being thinned. In this case, the peripheral modification layer M1 is not left in the processing target wafer W after being thinned. Further, within the processing target wafer W, a crack C1 develops from the multiple peripheral modification layers M1, and reaches the rear surface Wb and the front surface Wa.

In the process B9, according to the position of the chuck 100 decided by the control device 90, the chuck 100 is rotated by the rotating mechanism 103 and moved in the Y-axis direction by the moving mechanism 104 such that the center of the bonding region Aa and the center of the chuck 100 are aligned with each other. At this time, the rotation of the chuck 100 and the movement of the chuck 100 in the Y-axis direction are synchronized.

While rotating and moving the chuck 100 (processing target wafer W) as stated above, the laser light L1 is radiated to the inside of the processing target wafer W from the laser head 110. That is, the peripheral modification layer M1 is formed while correcting the second eccentric amount calculated in the process B7. As a result, the peripheral modification layer M1 is formed in a ring shape to be concentric with the bonding region Aa. Thus, in the periphery removing apparatus 61, the peripheral portion We can be appropriately removed, starting from the peripheral modification layer M1.

Further, in the present exemplary embodiment, if the second eccentric amount includes an X-axis component, this X-axis component is corrected by rotating the chuck 100 while moving it in the Y-axis direction. Meanwhile, if the second eccentric amount does not include the X-axis component, the chuck 100 only needs to be moved in the Y-axis direction without being rotated.

At the second position P2, the micro-camera 122 is disposed at a positive Y-axis side of the processing target wafer W held by the chuck 100, and the lens 111 of the laser head 110 is disposed at a negative Y-axis side of the processing target wafer W. In this case, in the process B9, the peripheral modification layer M1 is formed by the laser head 110, and the peripheral modification layer M1 is imaged by the micro-camera 122. The obtained image is outputted to the control device 90, and it is inspected in the control device 90 whether the peripheral modification layer M1 is formed at an appropriate position. By performing both the formation of the peripheral modification layer M1 and the inspection thereof, work efficiency can be improved. Further, if it is found out as a result of the inspection that the peripheral modification layer M1 is deviated from a required position, the movement of the chuck 100 may be finely adjusted.

While the peripheral modification layer M1 is being formed by radiating the laser light L1 to the inside of the processing target wafer W as described above, the height of the rear surface Wb of the processing target wafer W is measured by the sensor 113, and the radiation position of the laser light L1 is calculated by the control device 90. Then, the calculated radiation position of the laser light L1 is controlled to coincide with the origin position set in the process B8. To elaborate, the lens 111 is moved up and down by the piezo actuator 112 based on the calculated radiation position of the laser light L1. As described, in the process B9, the height of the laser light L1 is adjusted in real time.

Here, the sensor 113 is disposed coaxially with the laser light L1 radiated from the lens 111. A radiation radius of the laser light L1 (a radius of the peripheral modification layer) may differ, depending on a processing recipe of the process B9. In such a case, if the sensor 113 is provided on a separate axis from the laser light L1, the sensor 113 may measure the height of the rear surface Wb of the processing target wafer W at a position different from the position to which the laser light L1 is radiated, and the measured height may be deviated from an actual height. As a resolution, the sensor 113 is disposed coaxially with respect to the laser light L1 in the present exemplary embodiment.

In the process B9, by radiating the laser light L1 to the inside of the processing target wafer W one round, a single layer of peripheral modification layer M1 is formed. When the multiple peripheral modification layers M1 are formed at the different heights as in the present exemplary embodiment, the radiation position (radiation height) of the laser light L1 is changed. Hereinafter, a method of forming the multiple peripheral modification layers M1 in the present exemplary embodiment will be explained.

FIG. 19A and FIG. 19B are explanatory diagrams schematically illustrating the method of forming the multiple peripheral modification layers M1. A vertical axis represents a rotation speed, and a horizontal axis indicates time. In FIG. 19A and FIG. 19B, L1 denotes radiation of the laser light L1, and D denotes changing of a processing condition (processing recipe) when forming the peripheral modification layers M1. The processing condition changing D includes changing the radiation position of the laser light L1 by moving the lens 111 up and down, and changing conditions for the laser light L1, for example, an output (power), a frequency, a shape (laser pattern), and the branch number of the laser light L1. FIG. 19A shows a comparative example, and FIG. 19B shows an example of the present exemplary embodiment.

In the comparative example as shown in FIG. 19A, a single layer of peripheral modification layer M1 is formed by radiating the laser light L1 one round in the state that the rotation speed of the chuck 100 is maintained constant after the rotation of the chuck 100 is accelerated. Then, the rotation of the chuck 100 is decelerated, and in the state that the rotation of the chuck 100 is stopped, the processing condition changing D is performed. That is, whenever a single layer of peripheral modification layer M1 is formed, the processing condition changing D is performed. Whenever the processing condition changing D is performed, the acceleration and the deceleration of the rotation of the chuck 100 are repeated. As a result, it is time-consuming.

In contrast, in the present exemplary embodiment as shown in FIG. 19B, the processing condition changing D for the peripheral modification layer M1 is performed while rotating the chuck 100. That is, the rotation of the chuck 100 is not stopped when performing the processing condition changing D. For the reason, the acceleration and the deceleration of the rotation of the chuck 100 of the comparative example are not required, so that time can be saved. Thus, the time required to form the multiple peripheral modification layers M1 can be reduced. Further, in the example of FIG. 19A and FIG. 19B, t2 represents the time that can be reduced. If the time taken to form the multiple peripheral modification layers M1 is reduced, it may be possible to increase the number of the peripheral modification layers M1 to be formed.

Further, if the radiation of the laser light L1 and the processing condition changing D for the peripheral modification layer M1 are performed consecutively as shown in FIG. 19B, the radiation start position and a radiation end position of the laser light L1 when the single layer of peripheral modification layer M1 is formed may be deviated in the circumferential direction, as shown in FIG. 20.

Figure 21:
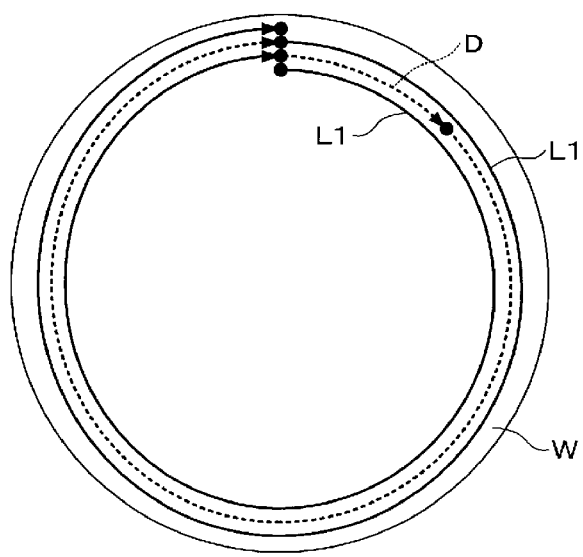
FIG. 21 is an explanatory diagram showing a state in which a plurality of peripheral modification layers is being formed.

Meanwhile, as illustrated in FIG. 21, the radiation start position and the radiation end position of the laser light L1 may be set to be identical when forming the single layer of peripheral modification layer M1. After the processing condition changing D for the peripheral modification layer M1 is performed, the laser light L1 is not radiated until the lens 111 is located above the radiation start position of the laser light L1. In this case as well, since the rotation of the chuck 100 is not stopped when performing the processing condition changing D, the time required to form the multiple peripheral modification layers M1 can be shortened.

Figure 22:
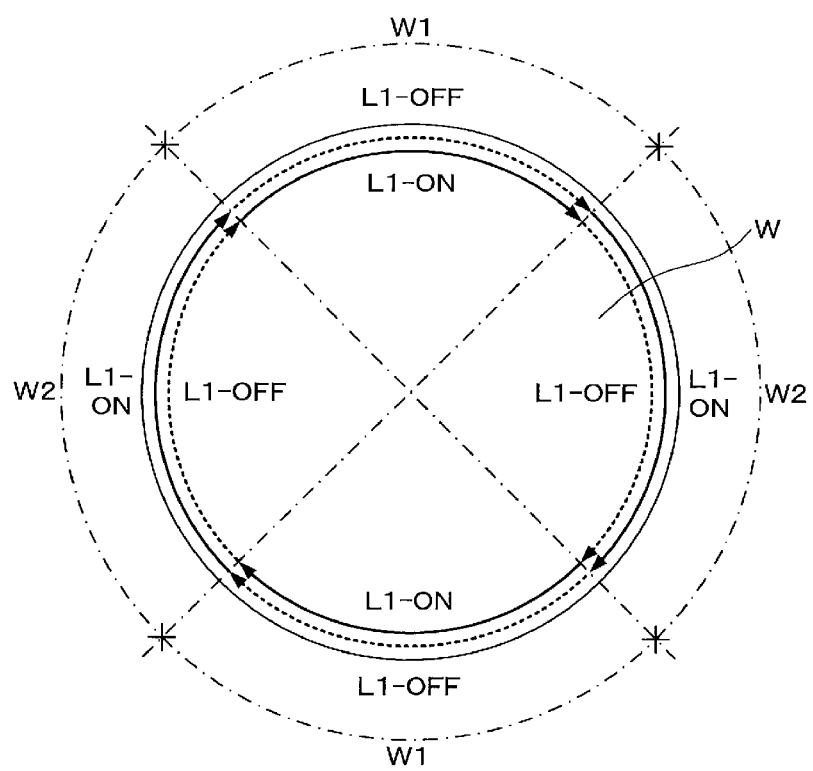
FIG. 22 is an explanatory diagram showing a state in which a single layer of peripheral modification layer is being formed.

Furthermore, in the example shown in FIG. 19A and FIG. 19B, the processing condition is changed for each peripheral modification layer M1 when the multiple modification layers M1 are formed. However, the condition of the laser light L1 may be changed during the formation of the single layer of peripheral modification layer M1, that is, during the one round of the laser light L1. For example, the condition of the laser light L1 may be changed depending on crystal orientation of silicon in the processing target wafer W. FIG. 22 is an explanatory diagram illustrating an example where the condition of the laser light L1 is changed during the one round thereof. In the example shown in FIG. 22, the processing target wafer W is divided into four, and the laser light L1 is radiated under one condition for the processing target wafers W1 and W1 which face each other diagonally, and the laser light L1 is radiated under another condition for the processing target wafers W2 and W2 which face each other diagonally.

When performing a processing shown in FIG. 22, in a comparative example, while rotating the chuck 100, the laser light L1 is radiated to the processing target wafers W1 and W1 in the first round while the radiation of the laser light L1 to the processing target wafers W2 and W2 is stopped. Then, in the state that the rotation of the chuck 100 is stopped, the condition of the laser light L1 is changed. Then, while rotating the chuck 100 again, the laser light L1 is radiated to the processing target wafers W2 and W2 in the second round while radiation of the laser light L1 to the processing target wafers W1 and W1 is stopped. In this case, since the acceleration and the deceleration of the rotation of the chuck 100 are performed when changing the condition of the laser light L1, it is time-consuming.

In contrast, in the present exemplary embodiment, the condition of the laser light L1 is changed while rotating the chuck 100. That is, the rotation of the chuck 100 is not stopped when the condition of the laser light L1 is changed. Accordingly, the acceleration and the deceleration of the rotation of the chuck 100 of the comparative example are not required, so that time can be saved. Thus, the time required to form the peripheral modification layer M1 can be reduced.

As shown in FIG. 23A and FIG. 23B, a notch Wn is formed at an edge portion of the processing target wafer W. By way of example, if the position where the peripheral modification layer M1 is formed overlaps with the notch Wn as illustrated in FIG. 23A, the laser light L1 is radiated to the notch Wn. As a result, a cross section of an end portion of the notch Wn to which the laser light L1 is radiated is roughened. Further, in the above-described process B9, when radiating the laser light L1 while rotating the chuck 100, the radiation position (radiation height) of the laser light L1 is adjusted (followed) in real time. If, however, the laser light L1 is radiated to the notch Wn, the radiation position of the laser light L1 is changed. Resultantly, it takes time to adjust the radiation position of the laser light L1 in real time at a place other than the notch Wn.

In view of the foregoing problem, in the present exemplary embodiment, the laser light L1 is controlled not to be radiated to the notch Wn, as illustrated in FIG. 23B. Since the location of the notch Wn in the processing target wafer W is known in advance, the radiation of the laser light L1 needs to be stopped at the moment when the lens 111 of the laser head 110 is located above the notch Wn. In this case, since the laser light L1 is not radiated to the notch Wn, the cross section of the end portion of the notch Wn is not roughened. Further, the real-time adjustment of the radiation position of the laser light L1 is stopped at the notch Wn. If so, the radiation position of the laser light L1 does not vary significantly in the one-round radiation of the laser light L1, making it easier to carry out the real-time adjustment at positions other than the notch Wn.

Figure 25:
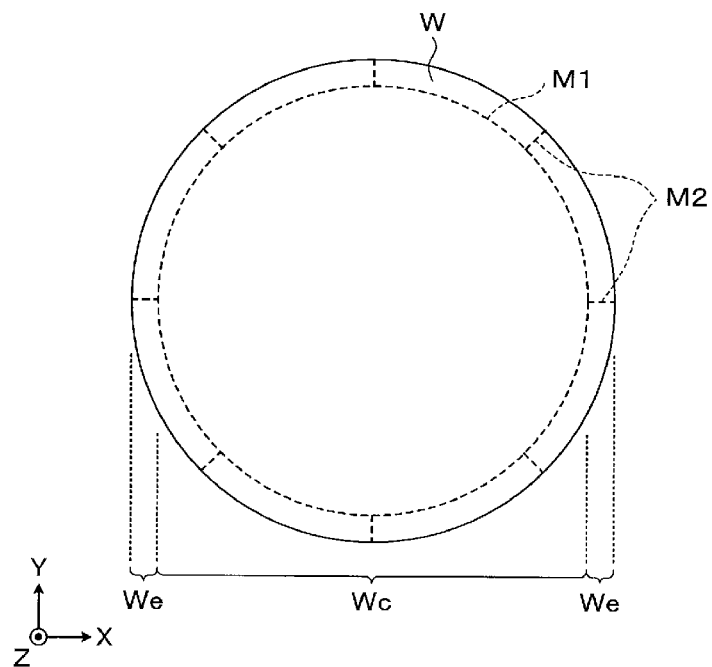
FIG. 25 is an explanatory diagram showing a state in which the split modification layer is formed in the processing target wafer.

If the peripheral modification layers M1 are formed as stated above, by radiating laser light L2 (laser light L2 for split) from the laser head 110, the split modification layer M2 is formed at an outer side than the peripheral modification layers M1 in the diametrical direction (process 1310 of FIG. 12, process A2 of FIG. 10), as illustrated in FIG. 24 and FIG. 25.

The split modification layer M2 is elongated in the thickness direction and has an aspect ratio with a vertically longer side, the same as the peripheral modification layer M1. Further, a crack C2 develops from the split modification layer M2, and reaches the front surface Wa and the rear surface Wb.

Furthermore, by forming multiple split modification layers M2 and cracks C2 at a pitch of several micrometers (μm) in the diametrical direction, a single line-shaped split modification layer M2 elongated outwards from the peripheral modification layer M1 in the diametrical direction is formed, as shown in FIG. 25. Further, in the shown example, the line-shaped split modification layer M2 elongated in the diametrical direction is formed at eight different positions. However, the number of the split modification layers M2 is not particularly limited. As long as the split modification layers M2 are formed at two different positions at least, the peripheral portion We can be removed. In this case, when removing the peripheral portion We in the edge trimming, this peripheral portion We is separated starting from the ring-shaped peripheral modification layer M1 to be split into multiple pieces by the split modification layers M2. Accordingly, the peripheral portion We to be removed is broken into smaller pieces, and thus can be removed more easily.

Figures 26A, 26B, 26C:
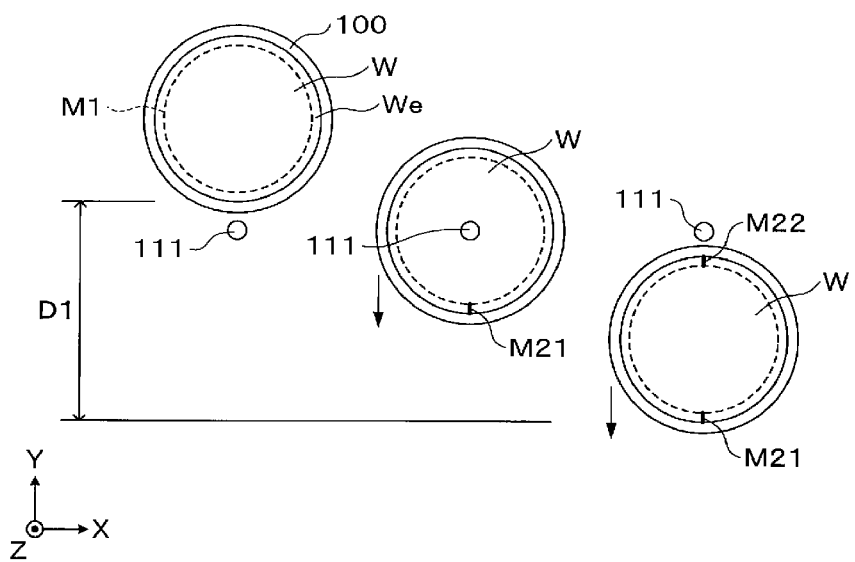
FIG. 26A to FIG. 26C are explanatory diagrams showing a state in which a split modification layer is being formed in a comparative example.

Here, in a comparative example, the split modification layer M2 may be formed by moving the chuck 100 in the Y-axis direction, as illustrated in FIG. 26A to FIG. 26C. That is, from the state in which the chuck 100 is located at a positive Y-axis side of the lens 111 as shown in FIG. 26A, the chuck 100 is moved in the negative Y-axis direction, as shown in FIG. 26B. When the processing target wafer W passes under the lens 111, the laser light L2 is radiated to one end of the peripheral portion We to form a split modification layer M21. Then, by moving the chuck 100 further in the negative Y-axis direction as shown in FIG. 26C, a split modification layer M22 is formed at the other end of the peripheral portion We. In this way, the split modification layers M21 and M22 are formed at the opposing portions of the peripheral portion We. In this case, a moving distance D1 of the chuck 100 is lengthened. To be specific, a single sheet of processing target wafer W, a distance for accelerating the chuck 100 and a distance for decelerating the chuck 100 need to be taken into account for the moving distance D1.

Figures 27A, 27B, 27C, 27D:
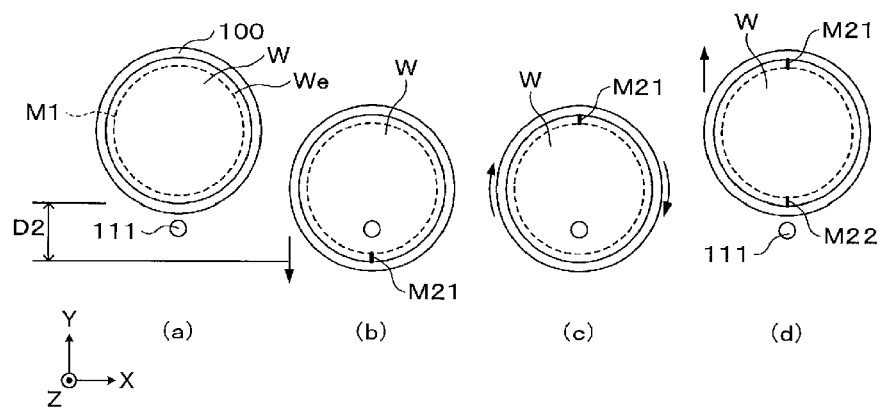
FIG. 27A to FIG. 27D are explanatory diagrams showing a state in which a split modification layer is being formed in the exemplary embodiment.

In contrast, in the process 1310 of the present exemplary embodiment, the split modification layer M2 is formed at only one end portion of the peripheral portion We as shown in FIG. 27A to FIG. 27D, and a moving distance of the chuck 100 is shortened by rotating the chuck 100. That is, from the state in which the chuck 100 is located at the positive Y-axis side of the lens 111 as shown in FIG. 27A, the chuck 100 is moved in the negative Y-axis direction, as shown in FIG. 27B. When the processing target wafer W passes under the lens 111, the laser light L2 is radiated to one end (one position in the circumferential direction) of the peripheral portion We to form the split modification layer M21. Then, the chuck 100 is rotated by 180 degrees, as illustrated in FIG. 27C. Thereafter, by moving the chuck 100 in the positive Y-axis direction as shown in FIG. 27D, the split modification layer M22 is formed at the other end (another position in the circumferential direction) of the peripheral portion We. In this case, a moving distance D2 of the chuck 100 is shortened. To be specific, a width of the split modification layer M2, a distance for accelerating the chuck 100 and a distance for decelerating the chuck 100 need to be taken into account for the moving distance D2.

As stated above, in the present exemplary embodiment, by shortening the moving distance of the chuck 100 in forming the split modification layer M2 in the process 1310, the occupation area (footprint) of the modifying apparatus 60 can be reduced, so that the space can be saved.

Furthermore, in the present exemplary embodiment, although the chuck 100 is moved in the Y-axis direction to form the split modification layer M2, the laser head 110 may be moved in the Y-axis direction.

Figure 28:
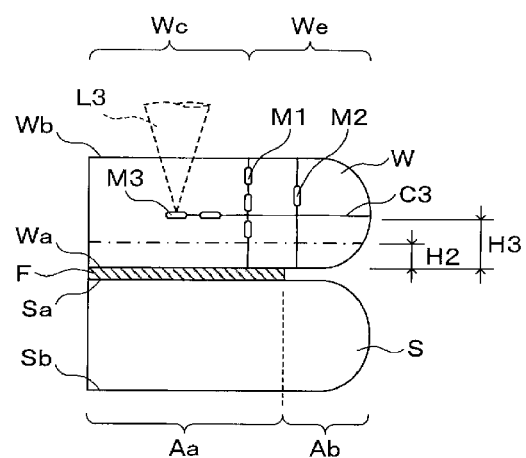
FIG. 28 is an explanatory diagram showing a state in which an internal modification layer is being formed in the processing target wafer.
Figure 29:
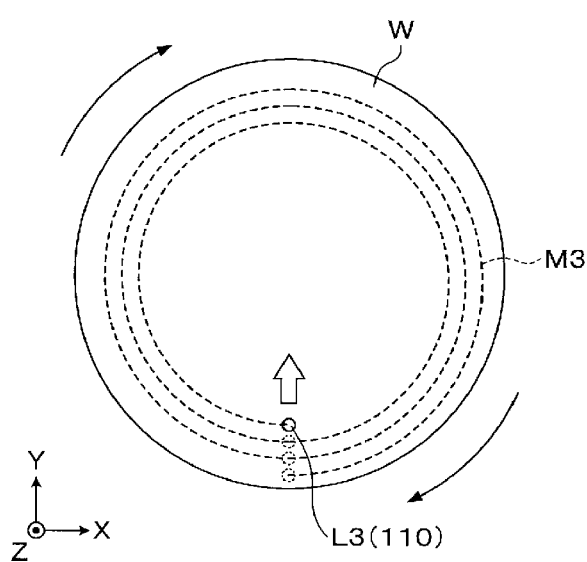
FIG. 29 is an explanatory diagram showing a state in which the internal modification layer is formed in the processing target wafer.

Subsequently, by radiating laser light L3 (laser light L3 for internal surface) from the laser head 110, the internal modification layer M3 is formed along a plane direction of the processing target wafer W (process B11 of FIG. 12, process A3 of FIG. 10), as illustrated in FIG. 28 and FIG. 29. Black arrows shown in FIG. 29 indicate a rotation direction of the chuck 100, the same as in the following description.

A lower end of the internal modification layer M3 is located slightly above the target surface (indicated by a dashed line in FIG. 28) of the processing target wafer W after being thinned. That is, a distance H3 between the lower end of the internal modification layer M3 and the front surface Wa of the processing target wafer W is slightly larger than the target thickness H2 of the processing target wafer W after being thinned. Within the processing target wafer W, a crack C3 develops from the internal modification layer M3 along the plane direction.

In the process B11, while rotating the chuck 100 (processing target wafer W) and moving the laser head 110 in the Y-axis direction from the peripheral portion of the processing target wafer W toward the central portion thereof, the laser light L3 is radiated from the laser head 110 to the inside of the processing target wafer W. As a result, the internal modification layer M3 is formed in a spiral shape from an outer side to an inner side within the surface of the processing target wafer W.

Although the laser head 110 is moved in the Y-axis direction to form the internal modification layer M3 in the present exemplary embodiment, the chuck 100 may be moved in the Y-axis direction. Further, although the chuck 100 is rotated to form the internal modification layer M3, it may be possible to rotate the laser head 110 relative to the chuck 100 by moving the laser head 110.

Figure 13D:
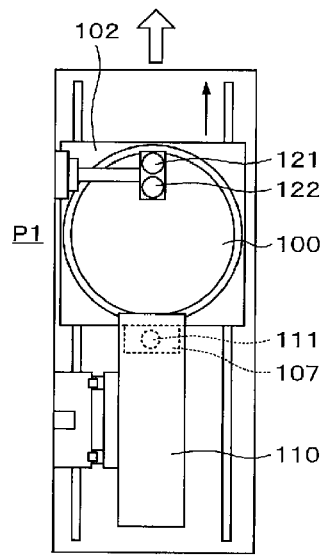

Next, the chuck 100 is moved to the first position P1, as depicted in FIG. 13D (process B12 of FIG. 12). Then, at the first position P1, the combined wafer T is carried out by the wafer transfer device 70 (process B13 of FIG. 12).

So far, a series of the processes performed in the modifying apparatus 60 has been described. Now, referring back to FIG. 10 and FIG. 11A to FIG. 11F, the wafer processing performed in the wafer processing system 1 will be explained.

Figure 11D:
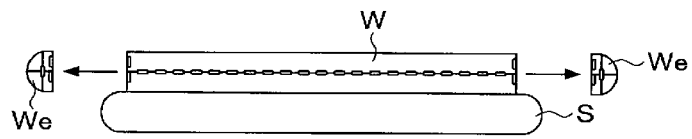

The combined wafer T carried out of the modifying apparatus 60 is then transferred into the periphery removing apparatus 61 by the wafer transfer device 70. In the periphery removing apparatus 61, the peripheral portion We of the processing target wafer W is removed starting from the peripheral modification layers M1 (process A4 of FIG. 10), as illustrated in FIG. 11D. In the process A4, as illustrated in FIG. 8, the wedge roller 141 is inserted into the interface between the processing target wafer W and the support wafer S from the outer ends of the processing target wafer W and the support wafer S. The peripheral portion We is lifted up by the inserted wedge roller 141, and is separated and removed from the processing target wafer W, starting from the peripheral modification layer M1. At this time, the peripheral portion We is separated while being broken into smaller pieces starting from the split modification layer M2. Further, the removed peripheral portion We is collected into the collector (not shown).

Figure 11E:
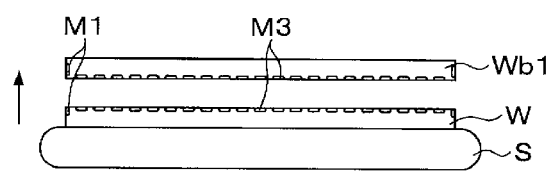

Thereafter, the combined wafer T is transferred into the processing apparatus 80 by the wafer transfer device 70. First, in the processing apparatus 80, the combined wafer T is delivered from the transfer ram 71 onto the chuck 83 at the delivery position A0. At this time, the rear surface Wb side of the processing target wafer W (hereinafter, referred to as "rear surface wafer Wb1") is separated starting from the internal modification layer M3 (process A5 of FIG. 10), as illustrated in FIG. 11E.

In the process A5, the support wafer S is attracted to and held by the chuck 83 while the processing target wafer W is attracted to and held by the attraction plate 170 of the transfer arm 71. Then, the attraction plate 170 is rotated, so that the rear surface wafer Wb1 is cut along the internal modification layer M3. Thereafter, the attraction plate 170 is raised in the state that the rear surface wafer Wb1 is attracted to and held by the attraction plate 170, so that the rear surface wafer Wb1 is separated from the processing target wafer W. At this time, by measuring a pressure for suctioning the rear surface wafer Wb1 with the pressure sensor 183, presence or absence of the rear surface wafer Wb1 is detected. Thus, it can be checked whether the rear surface wafer Wb1 is separated from the processing target wafer W. Further, the separated rear surface wafer Wb1 is collected to the outside of the wafer processing system 1.

Figure 11F:
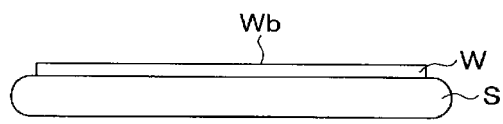

Subsequently, the chuck 83 is moved to the processing position B0. Then, the rear surface Wb of the processing target wafer W held by the chuck 83 is ground by the grinding unit 84, as shown in FIG. 11F to thereby remove the internal modification layer M3 and the peripheral modification layer M1 left on the rear surface Wb (process A6 of FIG. 10). In the process A6, by rotating the processing target wafer W and the grinding whetstone in the state that the rear surface Wb is in contact with the grinding whetstone, the rear surface Wb is ground. Further, the rear surface Wb of the processing target wafer W may be then cleaned by a cleaning liquid from a cleaning liquid nozzle (not shown).

Thereafter, the combined wafer T is transferred to the cleaning apparatus 41 by the wafer transfer device 70. In the cleaning apparatus 41, the ground rear surface Wb of the processing target wafer W is scrub-cleaned (process A7 of FIG. 10). Further, in the cleaning apparatus 41, the rear surface Sb of the support wafer S as well as the rear surface Wb of the processing target wafer W may be cleaned.

Afterwards, the combined wafer T is transferred to the etching apparatus 40 by the wafer transfer device 50. In the etching apparatus 40, the rear surface Wb of the processing target wafer W is wet-etched by the chemical liquid (process A8 of FIG. 10). A grinding mark may be formed on the rear surface Wb ground by the aforementioned processing apparatus 80. In the process A8, the grinding mark can be removed by performing the wet-etching, so that the rear surface Wb can be flattened.

Then, the combined wafer T after being subjected to all the required processings is transferred to the transition device 30 by the wafer transfer device 50, and then transferred into the cassette Ct on the cassette placing table 10 by the wafer transfer device 20. Accordingly, a series of the processes of the wafer processing in the wafer processing system 1 is ended.

According to the above-described exemplary embodiment, by shortening the time taken for each processing in the modifying apparatus 60, the throughput of the wafer processing can be improved. Concurrently, the modification quality (the modification accuracy) can also be improved.

That is, when performing the focus adjustment of the macro-camera 121 in the process B3, the focus adjustment is performed while moving the macro-camera 121 up and down. Further, when performing the focus adjustment of the micro-camera 122 in the process B6, the focus adjustment is performed while moving the micro-camera 122 up and down. Thus, the time for the focus adjustments in the processes B3 and B6 can be shortened.

Furthermore, when imaging the outer end portion of the processing target wafer W in the process B4, the outer end portion of the processing target wafer W is imaged while rotating the chuck 100. Further, when imaging the boundary between the bonding region Aa and the non-bonding region Ab of the processing target wafer W in the process B7, the boundary is imaged while rotating the chuck 100. Therefore, the time taken for the imaging in the processes B4 and B7 can be shortened. This reduction in the time taken for the imaging makes it possible to increase the repetition number of the imaging. As a result, the alignment can be performed appropriately, and the modification quality can be improved.

Moreover, when performing the radiation height adjustment of the laser light in the process B8, this radiation height adjustment is performed at the radiation start position of the laser light in the process B9. That is, the height of the rear surface Wb of the processing target wafer W is measured by the sensor 114 and the camera 115, and the radiation position (radiation height) of the laser light is calculated by the control device 90. Since the calculated radiation position is set as the origin position of the radiation position of the laser light in the sensor 113 (zero point adjustment), the radiation height adjustment can be carried out appropriately. As a result, the peripheral modification layer M1 can be formed at the appropriate height, which leads to improvement of the modification quality. Additionally, since the zero point adjustment is performed while moving the lens 111 up and down in the process B8, the time taken for the radiation height adjustment can be reduced.

Furthermore, when forming the peripheral modification layer M1 in the process B9, the radiation position of the laser light is adjusted in real time by using the sensor 113 which is provided coaxially with the laser light L1, the peripheral modification layer M1 can be formed at the appropriate height, so that the modification quality can be improved.

In addition, when forming the peripheral modification layer M1 in the process B9, the processing condition for forming the peripheral modification layer M1 is changed while rotating the chuck 100. Therefore, the time required to form the peripheral modification layer M1 can be reduced. This reduction in the time required to form the peripheral modification layer M1 makes it possible to increase the number of the peripheral modification layers M1 to be formed.

Further, when forming the peripheral modification layer M1 in the process B9, the laser light L1 is not radiated to the notch Wn. Accordingly, the cross section of the end portion of the notch Wn is not roughened, so that the modification quality can be improved. Further, the real-time adjustment of the radiation position of the laser light L1 is stopped at the notch Wn. Thus, the radiation position of the laser light L1 does not change significantly, making it easier to perform the real-time adjustment at a place other than the notch Wn.

Moreover, in the above-described exemplary embodiment, although the removing of the peripheral portion We is performed by using the periphery remover 140 in the periphery removing apparatus 61, the way how to remove the peripheral portion We is not limited thereto. By way of example, the peripheral portion We may be removed by being held, or by applying a physical impact, an ultrasonic wave, or the like to the peripheral portion We.

Additionally, in the above-described exemplary embodiment, although the separation of the rear surface wafer Wb1 from the processing target wafer W is performed when the combined wafer T is delivered to the chuck 83 of the processing apparatus 80 from the transfer arm 71 of the wafer transfer device 70, the way how to separate the rear surface wafer Wb1 is not limited thereto. By way of example, a separating device (not shown) may be provided in the same apparatus where the periphery removing apparatus 61 is provided, or this separating device (not shown) may be provided separately.

Further, in the above-described exemplary embodiment, although the thinning of the processing target wafer W is accomplished by separating the rear surface wafer Wb1, the way how to thin the processing target wafer W is not limited thereto. By way of example, the rear surface Wb of the processing target wafer W may be ground, or the rear surface Wb may be etched.

It should be noted that the exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to reduce the time required to remove, in the combined substrate in which the substrates are bonded to each other, the peripheral portion of one substrate.

I claim:

1. A substrate processing apparatus configured to process a combined substrate in which a first substrate and a second substrate are bonded to each other, the substrate processing apparatus comprising:
   a holder configured to hold the combined substrate from a second substrate side;
   a first camera configured to image the first substrate held by the holder;
   a laser head configured to form a modification layer by radiating laser light to an inside of the first substrate held by the holder along a boundary between a peripheral portion of the first substrate as a removing target and a central portion thereof;
   a first moving device configured to move the holder and the first camera relatively;
   a second moving device configured to move the holder and the laser head relatively; and
   a controller configured to control the holder, the first camera, the laser head, the first moving device and the second moving device,
   wherein the first camera images multiple points of the first substrate after performing focus adjustment at plural points of the first substrate, and
   the controller controls the holder, the first camera and the first moving device to perform the focus adjustment of the first camera while fixing the holder and moving the first camera up or down, and perform the imaging by the first camera while fixing the first camera and rotating the holder.

2. The substrate processing apparatus of claim 1, further comprising:
   a first sensor disposed on a separate axis from the laser light radiated from the laser head, and configured to adjust a radiation position of the laser light radiated from the laser head, wherein the controller controls the adjuster to adjust a height of a radiation start position in the first substrate where the radiation of the laser light from the laser head is begun, before forming the modification layer by the laser head, and sets an origin position of the radiation position of the laser light based on the adjusted height.

3. The substrate processing apparatus of claim 2, wherein
the first sensor is configured to measure a height of a front surface of the first substrate held by the holder, and
wherein the substrate processing apparatus further comprises a second camera configured to image the front surface of the first substrate held by the holder,
wherein the controller calculates the radiation position of the laser light based on the height of the front surface of the first substrate acquired from an image obtained by the second camera.

4. The substrate processing apparatus of claim 2,
wherein the controller controls the holder, the laser head and the second moving device to set the origin position of the radiation position of the laser light while moving the holder and the modifying device laser head relatively.

5. The substrate processing apparatus of claim 2, further comprising:
a second sensor provided coaxially with the laser light radiated from the laser head, and configured to measure a height of the first substrate held by the holder,
wherein the controller controls the holder, the laser head, the second moving device and the second sensor to measure the height of the first substrate by the second sensor while forming the modification layer by the laser head, and to allow the radiation position of the laser light to coincide with the origin position based on the measured height.

6. The substrate processing apparatus of claim 5,
wherein the second sensor measures a height of a front surface of the first substrate, and
the controller calculates the radiation position of the laser light based on the measured height of the front surface of the first substrate.

7. The substrate processing apparatus of claim 1,
wherein the controller controls the holder, the second moving device and the laser head to form the modification layer by the laser head while rotating the holder, and to change a processing condition when forming the modification layer by the laser head while maintaining the rotating of the holder.

8. The substrate processing apparatus of claim 7,
wherein the modification layer includes multiple modification layers, and
the laser head forms the multiple modification layers at different heights, and
the controller changes the processing condition for each of the multiple modification layers.

9. The substrate processing apparatus of claim 7,
wherein the controller changes the processing condition for each of required areas of a single modification layer.

10. The substrate processing apparatus of claim 1,
wherein a notch is formed at the first substrate, and
the controller controls the holder, the second moving device and the laser head such that the laser light is not radiated to the notch from the laser head when the modification layer is formed by the laser head while rotating the holder.

11. A substrate processing method of processing a combined substrate in which a first substrate and a second substrate are bonded to each other, the substrate processing method comprising:
holding the combined substrate from a second substrate side by a holder;
imaging the first substrate held by the holder by a first camera; and
forming a modification layer by radiating laser light from a laser head to an inside of the first substrate held by the holder along a boundary between a peripheral portion of the first substrate as a removing target and a central portion thereof,
wherein when the imaging by the first camera is performed, multiple points of the first substrate are imaged after focus adjustment at plural points of the first substrate is performed, and
the focus adjustment of the first camera is performed while fixing the holder and moving the first camera up or down, and the imaging by the first camera is performed while fixing the first camera and rotating the holder.

12. The substrate processing method of claim 11, further comprising:
adjusting a radiation position of the laser light radiated from the laser head, by a first sensor,
wherein a height of a radiation start position in the first substrate where the radiation of the laser light from the laser head is begun is adjusted by the first sensor before the forming of the modification layer by the laser head, and an origin position of the radiation position of the laser light is set based on the adjusted height.

13. The substrate processing method of claim 12,
wherein, in the adjusting of the radiation position of the laser light,
a front surface of the first substrate is searched by measuring, with the first sensor, a height of the front surface of the first substrate held by the holder, and
the first substrate held by the holder is imaged by a second camera, the height of the front surface of the first substrate is acquired from an image obtained by the second camera, and the radiation position of the laser light is calculated based on the acquired height of the front surface of the first substrate.

14. The substrate processing method of claim 12,
wherein the origin position of the radiation position of the laser light is set while moving the holder and the laser head relatively.

15. The substrate processing method of claim 12, further comprising:
measuring a height of the first substrate held by the holder, by a second sensor provided coaxially with the laser light radiated from the laser head,
wherein, while forming the modification layer by the laser head, the height of the first substrate is measured by the second sensor and the radiation position of the laser light is allowed to coincide with the origin position based on the measured height.

16. The substrate processing method of claim 15,
wherein a height of a front surface of the first substrate is measured by the second sensor, and
the radiation position of the laser light is calculated based on the measured height of the front surface of the first substrate.

17. The substrate processing method of claim 11,
wherein the modification layer is formed by the laser head while rotating the holder, and a processing condition when forming the modification layer by the laser head is changed while maintaining the rotating of the holder.

18. The substrate processing method of claim 17,
wherein the modification layer includes multiple modification layers,
the multiple modification layers are formed at different heights by the laser head, and
the processing condition is changed for each of the multiple modification layers.

19. The substrate processing method of claim 17,
wherein the processing condition is changed for each of required areas of a single modification layer.

20. The substrate processing method of claim 11,
wherein a notch is formed at the first substrate, and
the laser light is not radiated to the notch from the laser head when forming the modification layer by the laser head while rotating the holder.

* * * * *